(12) United States Patent
Wang

(10) Patent No.: US 7,945,872 B2
(45) Date of Patent: May 17, 2011

(54) VERIFYING AN IC LAYOUT IN INDIVIDUAL REGIONS AND COMBINING RESULTS

(75) Inventor: Yulan Wang, Fremont, CA (US)

(73) Assignee: SYNOPSYS, Inc., Mountain View, CA (US)

( * ) Notice: Subject to any disclaimer, the term of this patent is extended or adjusted under 35 U.S.C. 154(b) by 0 days.

(21) Appl. No.: 12/559,478

(22) Filed: Sep. 14, 2009

(65) Prior Publication Data

US 2010/0005434 A1 Jan. 7, 2010

Related U.S. Application Data

(63) Continuation of application No. 11/134,721, filed on May 20, 2005, now Pat. No. 7,617,464.

(51) Int. Cl.
*G06F 17/50* (2006.01)
(52) U.S. Cl. .......................................... 716/52; 716/51
(58) Field of Classification Search ............ 716/5, 51–52
See application file for complete search history.

(56) References Cited

U.S. PATENT DOCUMENTS

| 5,062,054 | A | 10/1991 | Kawakami et al. |
| 5,497,334 | A | 3/1996 | Russell et al. |
| 5,528,508 | A | 6/1996 | Russell et al. |
| 5,581,475 | A | 12/1996 | Majors |
| 6,077,310 | A | 6/2000 | Yamamoto et al. |
| 6,237,128 | B1 | 5/2001 | Folberth et al. |
| 6,282,696 | B1 | 8/2001 | Garza et al. |
| 6,324,673 | B1 | 11/2001 | Luo et al. |
| 6,341,366 | B1 | 1/2002 | Wang et al. |
| 6,470,482 | B1 | 10/2002 | Rostoker et al. |
| 6,748,571 | B2 | 6/2004 | Miwa |
| 6,871,332 | B2 | 3/2005 | Li et al. |
| 6,883,149 | B2 | 4/2005 | Li et al. |
| 6,910,193 | B1 | 6/2005 | McBride |
| 7,000,208 | B2 | 2/2006 | Zhang |
| 7,047,510 | B1 | 5/2006 | Chopra et al. |
| 7,051,307 | B2 | 5/2006 | Ditlow et al. |
| 7,065,729 | B1 | 6/2006 | Chapman |
| 7,089,519 | B1 | 8/2006 | Teig |
| 7,096,445 | B1 | 8/2006 | Pucci et al. |
| 7,107,559 | B2 | 9/2006 | Lakshmanan et al. |

(Continued)

OTHER PUBLICATIONS

Scherber et al., "Palace: A parallel and hierarchical layout analyzer and circuit extractor", Mar. 1996, European Design and Test Conference, pp. 357-361.

(Continued)

*Primary Examiner* — Vuthe Siek
*Assistant Examiner* — Patrick Sandoval
(74) *Attorney, Agent, or Firm* — Silicon Valley Patent Group LLP; Omkar Suryadevara

(57) ABSTRACT

When performing rule checking locally within any given region of a layout of an integrated circuit, certain data is generated to be checked globally, regardless of boundaries (hereinafter "to-be-globally-checked" data). The to-be-globally-checked data, resulting from execution of a given rule in each region of the IC layout, is merged across all regions, and the same rule (i.e. the given rule) is executed globally on the merged data. When an entire runset has been executed in all regions individually, and also executed globally on the merged data, the results thereof are all merged together to yield a final result of a complete execution of the entire runset over the entire IC layout. In some embodiments, certain additional data that could not be rule checked due to the presence of boundaries of adjacent regions is propagated between successive rules in each region.

18 Claims, 15 Drawing Sheets

U.S. PATENT DOCUMENTS

| | | |
|---|---|---|
| 7,404,164 B2 | 7/2008 | Papadopoulou et al. |
| 2003/0061583 A1 | 3/2003 | Malhotra |
| 2004/0064795 A1 | 4/2004 | Li et al. |
| 2005/0216875 A1 | 9/2005 | Zhang et al. |
| 2005/0283747 A1 | 12/2005 | Adam |
| 2006/0294488 A1 | 12/2006 | Waller |
| 2007/0174807 A1 | 7/2007 | Kumashiro et al. |
| 2007/0234265 A1 | 10/2007 | Vuong et al. |
| 2008/0005704 A1 | 1/2008 | Miloslavsky et al. |

OTHER PUBLICATIONS

Entire Prosecution History of U.S. Appl. No. 11/134,721, filed May 20, 2005 by Yulan Wang issued as US Patent 7,617,464.

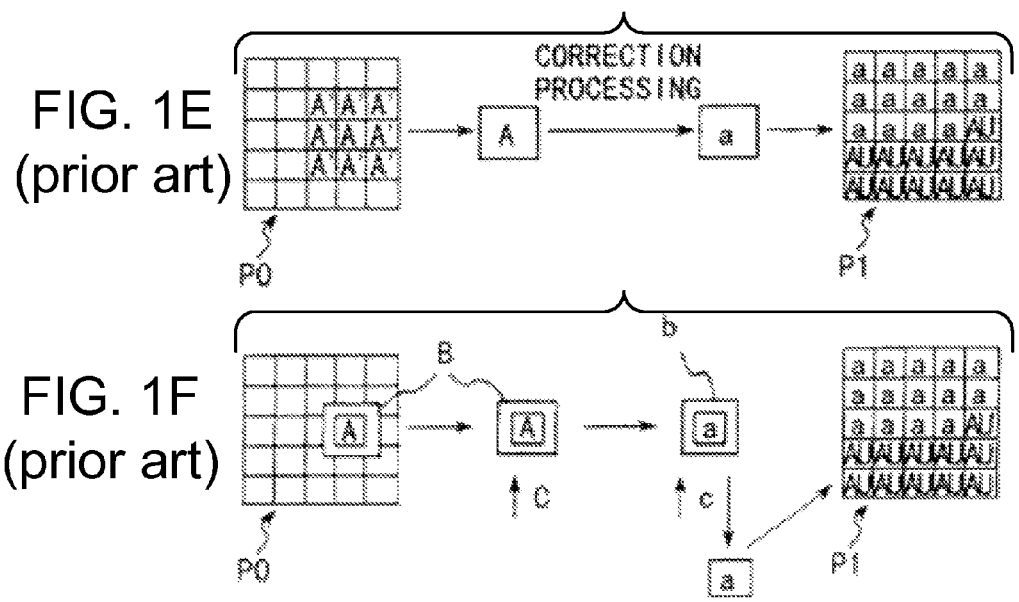
FIG. 1E (prior art)
FIG. 1F (prior art)
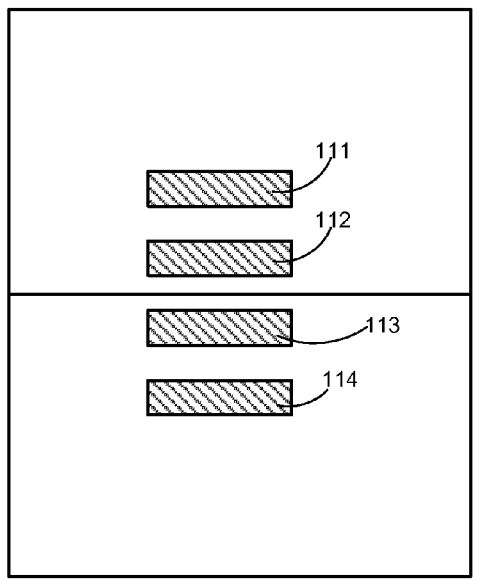
FIG. 1G (prior art)
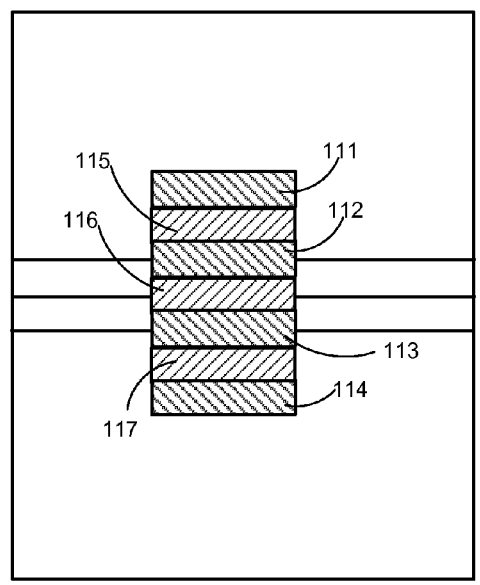
FIG. 1H (prior art)

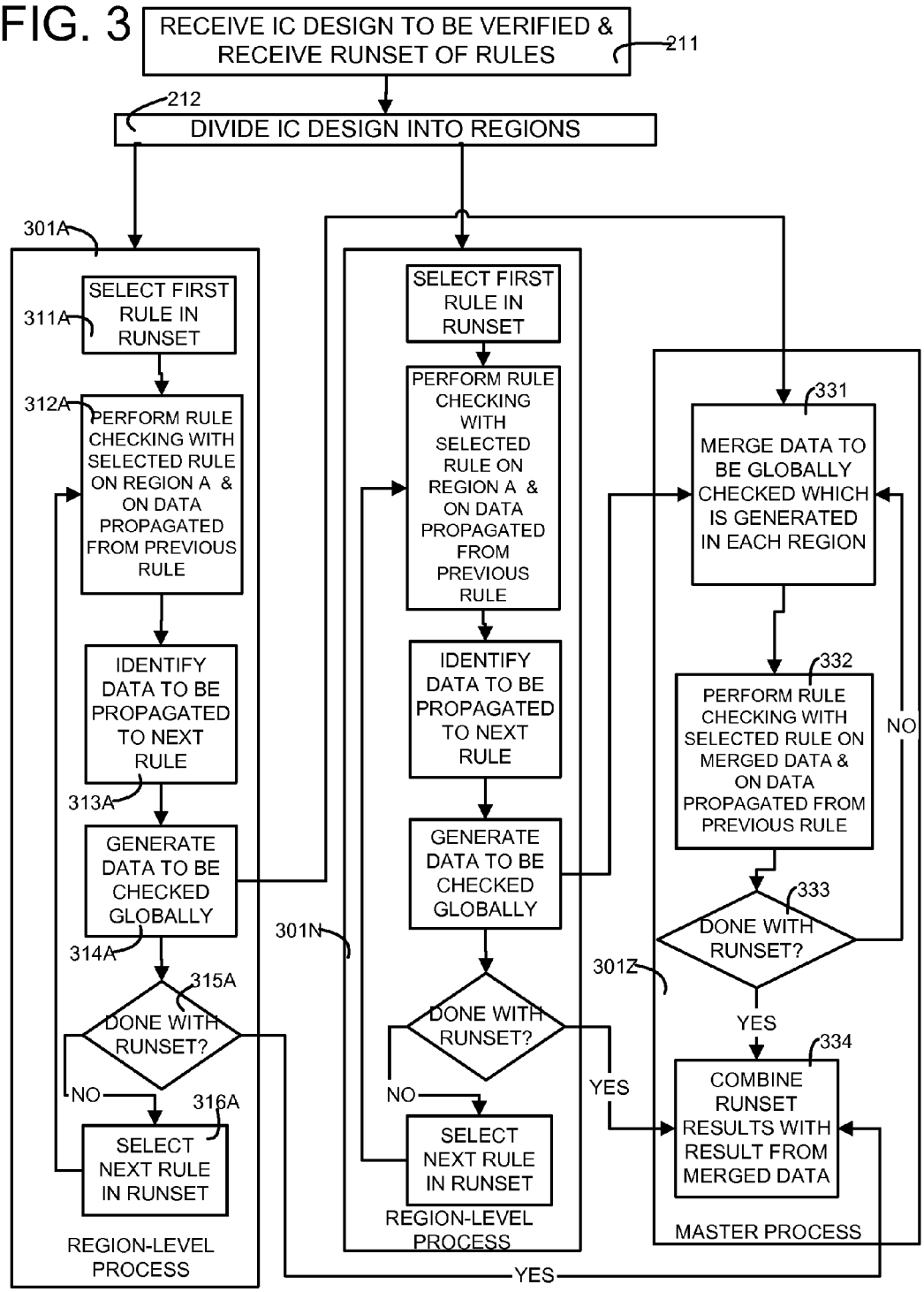

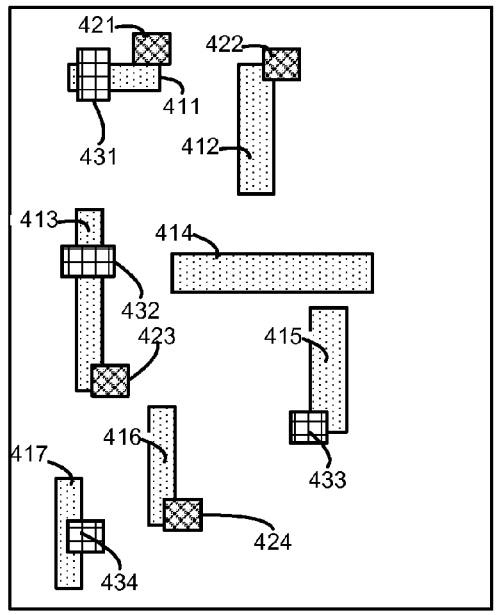
FIG. 4A (prior art)
KEY
- RED
- GREEN
- BLUE
FIG. 4B (prior art)
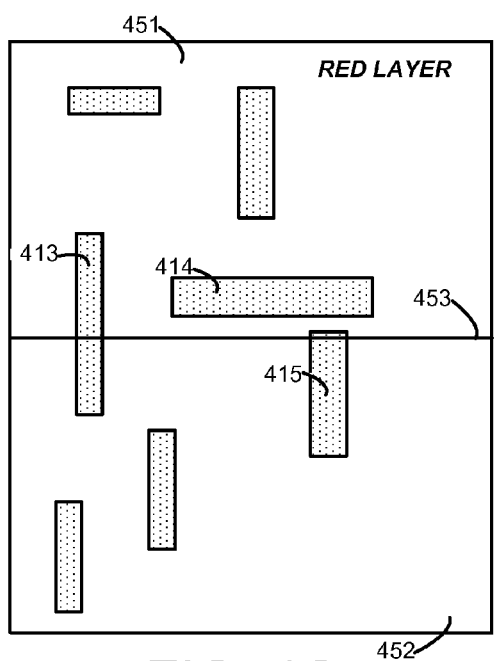
FIG. 4C
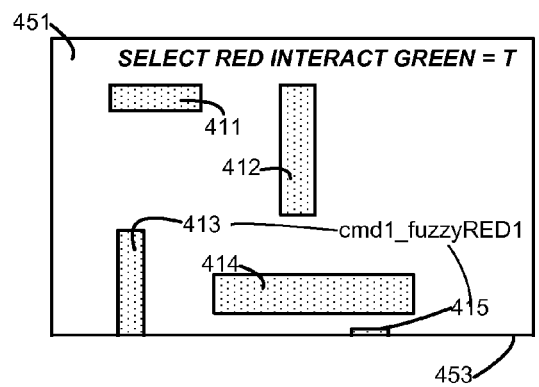
FIG. 4D

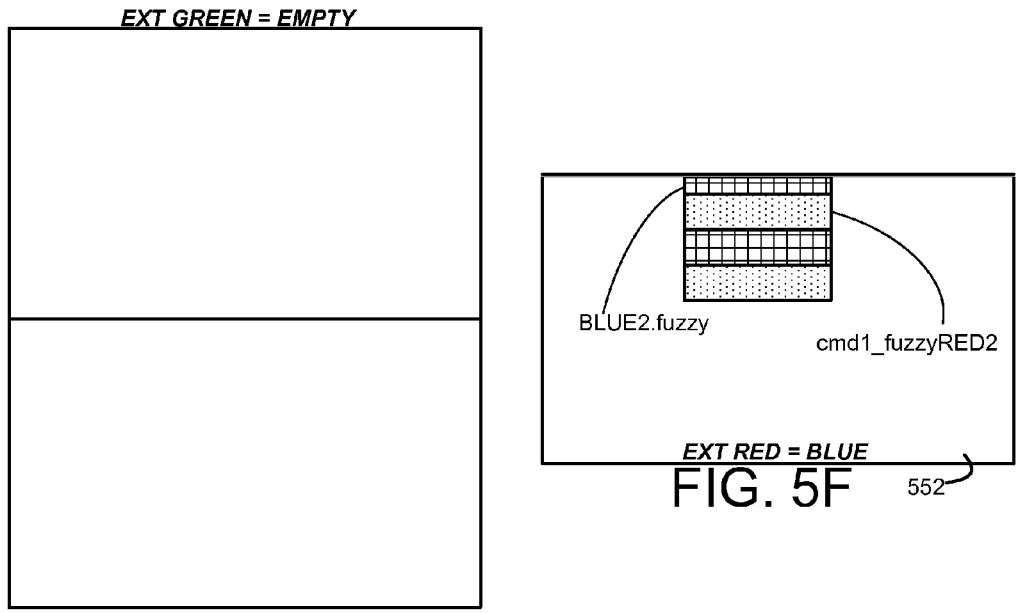
FIG. 5E
FIG. 5F
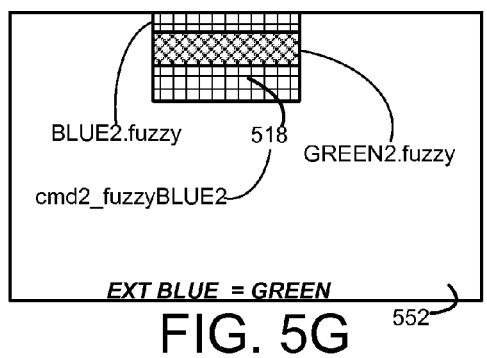
FIG. 5G
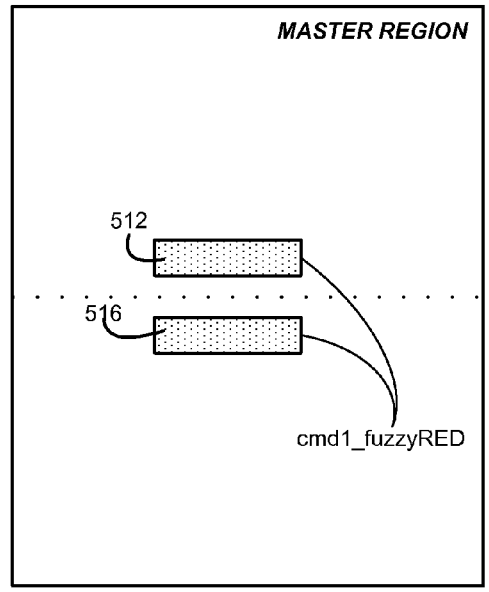
FIG. 5H

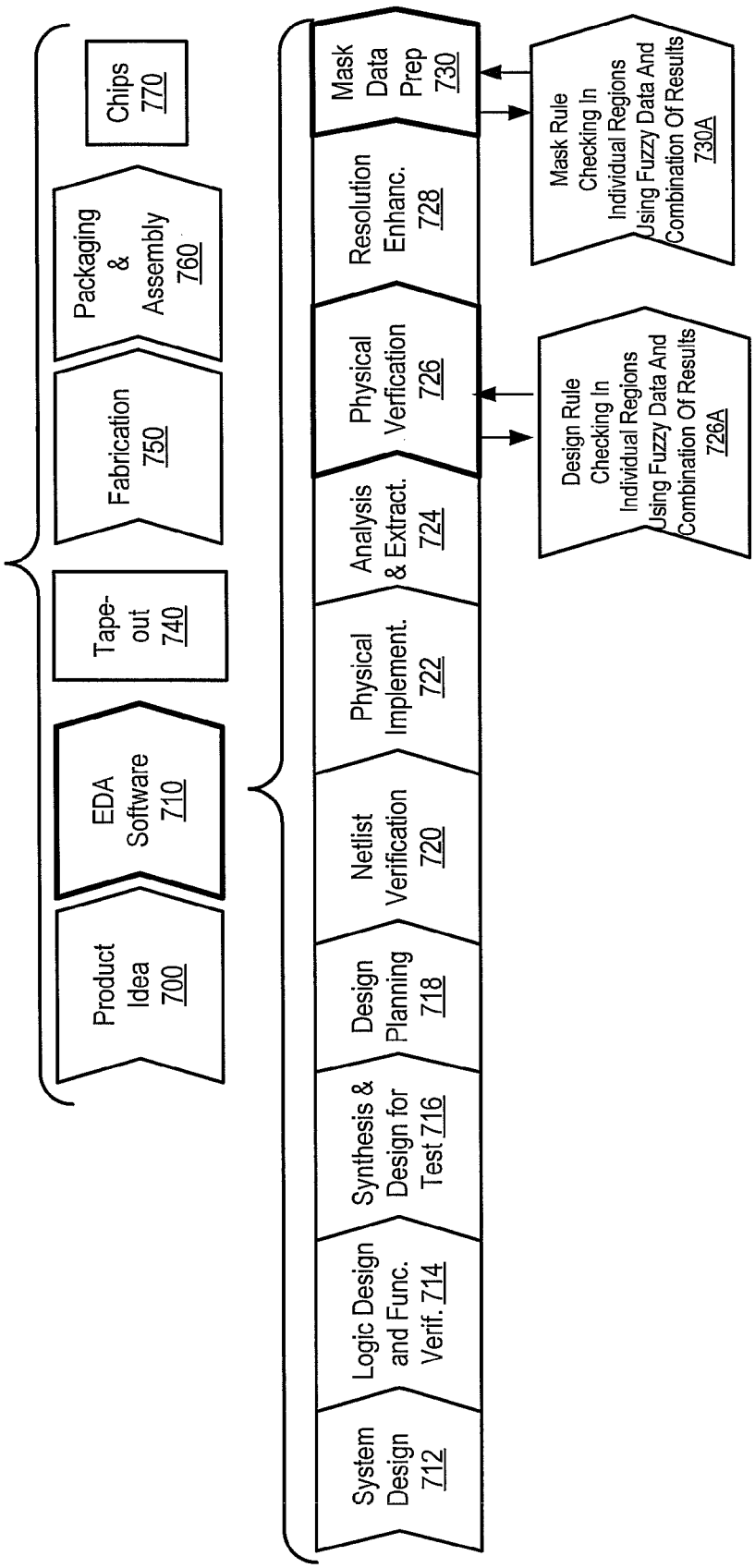

VERIFYING AN IC LAYOUT IN INDIVIDUAL REGIONS AND COMBINING RESULTS

CROSS-REFERENCE TO PARENT APPLICATION

This application is a continuation application of U.S. patent application Ser. No. 11/134,721 filed on May 20, 2005, now U.S. Pat. No. 7,617,464, which is incorporated by reference herein in its entirety.

BACKGROUND

1. Field of the Invention

The invention relates to the design of semiconductor chips. More specifically, the invention relates to a method and an apparatus for verifying a large design of an integrated circuit (IC) layout, by verification of small regions of the layout, and combination of the results.

2. Related Art

A computer programmed with appropriate software (called layout verification tool) is normally used to verify that an overall design of an integrated circuit (IC) chip conforms to certain predetermined tolerances that are required by a process to be used in fabricating the chip. Examples of such a layout verification tool include (1) HERCULES software available from Synopsys, Inc. 700 East Middlefield Road, Mountain View, Calif. 94043, and web site www.synopsys.com, (2) VAMPIRE software available from Cadence Design Systems, Inc, 555 River Oaks Parkway, San Jose, Calif. 95134, and web site www.cadence.com, and (3) CALIBRE software available from Mentor Graphics Corporation, 8005 SW Boeckman Road, Wilsonville, Oreg., 97070, and web site www.mentor.com.

Tolerances for the process that is to be used to fabricate the IC chip are often specified by IC chip designers in the form of "rules" that are used by the layout verification tool to confirm that a chip's design can be manufactured by an IC fabrication process (in an operation called "design rule check" (DRC) or "mask rule check" (MRC), depending on whether or not the design has been Optical Proximity Corrected). Examples of rules (also called "verification rules") to be used in checking an IC design include: (1) minimum width of a trace (i.e. line) or other feature, (2) minimum spacing between elements of a circuit (e.g. between adjacent lines), (3) minimum width of notches and (4) checks for acute angles.

Verification rules are normally stored in a predetermined sequence (e.g. in a computer file) commonly called a "runset" (also called "rule set," "rule file," "rule deck," or "rule scripts"). The runset is supplied as input to the layout verification tool, for use in checking if a design conforms to rules in the runset. The rules may be applied to the entire layout of the IC design, if the design is sufficiently small and the layout verification tool is executing in a computer that has sufficient resources (e.g. memory and computation power).

However, as IC designs get bigger, a single computer does not have sufficient memory and/or computation power to verify and synthesize an entire mask layout before manufacture. Hence, a large IC design (illustrated in FIG. 1A) is partitioned into multiple regions (two regions are illustrated in FIG. 1B) with the layout verification tool being applied to each region independent of another region (as illustrated in FIGS. 1C and 1D).

Execution of a runset on each individual region, independent of another individual region, creates artifacts when shapes cross a boundary between regions. In the illustration of FIG. 1C, a rule applicable to shapes that interact is not applied to rectangle 101, although rectangle 101 interacts with rectangle 102 as shown in FIG. 1D.

Such artifacts may be avoided by manually partitioning a large layout into multiple regions while taking care to avoid cutting a shape. However, manual partitioning is labor intensive, and there is no known method to ensure that satisfactory partitions are made of a large and complex IC layout.

One prior art method for reducing such artifacts is described in U.S. Pat. No. 6,077,310 granted to Yamamoto et al. on Jun. 20, 2000 entitled "Optical Proximity Correction System", which is incorporated by reference herein in its entirety. This patent describes the conventional method as shown in FIG. 1E and the use of overlapping regions at the boundaries of a region-under-verification in FIG. 1F. See Yamamoto's column 7 lines 28-44.

As shown in FIG. 1F, Yamamoto adds a buffer area B to the periphery of a to-be-corrected area A. The to-be-corrected area A and the buffer area B are combined to form an area C on which calculations for proximity correction are performed. In FIG. 1E, c is an already corrected optical proximity effect calculation area, b is the buffer area of c, and a is the corrected solution of the to-be-corrected area. Note that a buffer area is also called "ambit" in some prior art systems use a similar technique in rule checking (DRC or MRC).

The inventor of the current patent application has recognized that prior art methods using buffer areas result in two types of problems, a global scope problem and a local scope problem as discussed next. Specifically, in a global scope problem illustrated in FIG. 1C, when verifying the upper region of the IC design, rectangle 101 that spans across two regions may still not be selected if the buffer area (or ambit) is not sufficiently wide to include a portion of rectangle 102.

In a local scope problem illustrated in FIGS. 1G-1L, initially there are two rectangles 111 and 112 in the upper region and two rectangles 113 and 114 in the lower region, as shown in FIG. 1G, and the space between rectangles is marked as 115, 116 and 117 as shown in FIG. 1H. Note that FIGS. 1I and 1J illustrate the independent and individual checking of the upper region and the lower region respectively, while using boundary areas. Next, referring to FIG. 1K, the space between rectangles 115, 116 and 117 is marked again, as 118 and 119 shown in FIG. 1L. Therefore, at this stage, in the upper region there is one rectangle 118.

Hence a check for space between two rectangles at this stage, when applied to only the upper region results in an empty set. Similarly in verifying the lower region as well, as there is only one rectangle 119 that is left, just before the last rule in the runset is executed, the space between rectangles is an empty set also. Therefore, a space 120 which is in fact located between rectangles 117 and 118 is not detected when performing verification in each of the upper region and the lower region independently, even though using ambit.

In some instances, it may be possible for an IC chip designer to prepare a runset that contains commands to overcome the above-described problems, but such an "intelligent" runset is not generic across IC designs, and also not scaleable (because manual customization is required).

SUMMARY

A computer is programmed, in accordance with the invention, to automatically generate and propagate internally, while working on each individual region (into which an IC layout is subdivided), certain data (called "locally-unknown data") between successive rules of a runset. The locally-unknown data is passed, from execution of one rule to execution of a next rule in a given region, in the same manner as (and in addition to) a result of performing rule checking locally in the given region. In addition, in some embodiments, the computer is programmed, to generate and transfer additional data (called "to-be-globally-checked data") from each region on which a given rule is being checked, for rule checking across the entire IC layout as a whole, regardless of region boundaries. The to-be-globally-checked data that is generated from each region, is merged across multiple regions (e.g. all regions in some embodiments), and rule checking is performed with the same rule (i.e. the given rule) on the merged data. In these embodiments, individual results of rule checking the entire runset in individual regions are combined with the result of rule checking the runset on merged data on a global scale, to yield a final result of execution of the runset over the entire IC layout.

BRIEF DESCRIPTION OF THE FIGURES

FIGS. 1E and 1F illustrate a solution described in U.S. Pat. No. 6,077,310 granted to Yamamoto.

FIGS. 1G-1L illustrate a problem associated with a use of a boundary area (also called ambit) when individual regions are rule checked independently of each other.

FIG. 3 illustrates, in an intermediate-level flow chart, acts performed in some embodiments of the invention, to implement the acts of FIG. 2D.

FIG. 4A illustrates a prior art example of the type shown in FIG. 1A with reference numerals added thereon, and FIG. 4B provides a key to identify the layers to which shapes in FIG. 4A belong.

FIGS. 4C-4L illustrate the method of FIG. 3 applied to the example of FIGS. 4A-4B.

FIGS. 5A-5L illustrate the method of FIG. 3 applied to the example of FIG. 1G.

FIG. 7 illustrates, a simplified representation of an exemplary digital ASIC design flow in accordance with the invention.

DETAILED DESCRIPTION

A system 200 (FIG. 2A) in accordance with the invention uses several processes 201A, 201J and 201N (where N is the number of processes) to verify a single IC layout. Specifically, each process 201J works on a single portion (also called "region") of an IC layout 203, to check for violation of rules (such as DRC rules and MRC rules) in that single portion. In the embodiment illustrated in FIG. 2A, each process 201J executes in a corresponding processor 200J present in system 200. Processes 201A-201N are also referred to herein as region-level processes because each of these processes perform rule checking on an individual region 203J (FIG. 2B) of IC layout 203.

System 200 in accordance with the invention also uses an additional process 201Z (also called "master process") that works on a global scale. Master process 201Z is programmed to check for violation of rules regardless of boundaries, such as boundaries 204X1, 204X2, 204Y1 and 204Y2 between regions 203A-203N (FIG. 2B). Master process 201Z (FIG. 2A) receives as input certain data (called "to-be-globally-checked data") that is generated by processes 201A-201N. This to-be-globally-checked data is then rule checked by process 201Z, regardless of region boundaries. This to-be-globally-checked data is also referred to herein as a kind of "fuzzy" data. Specifically, master process 201Z merges "to-be-globally-checked" data generated by processes 201A-201N, and performs rule checking on the merged data, using the same rule that is applied to the respective regions by processes 201A-201N.

In many embodiments, most of an IC layout's data in a given region 203J is rule checked by a corresponding region-level process 201J, and hence the amount of fuzzy data that is "generated" and therefore the amount of merged data to be rule checked by the master process 201Z is small (as compared to the amount of data in the original layout). For this reason, master process 201Z consumes less resources (CPU and memory) and completes more quickly than a prior art process that rule checks the entire IC layout as a whole (without subdivision). Moreover, use of a master process 201Z that operates regardless of region boundaries (in addition to region-level processes) eliminates one or more artifacts that otherwise arise from the prior art use of "ambit" (as discussed above in reference to FIGS. 1E-1L).

Master process 201Z of some embodiments is programmed to operate in a pipelined manner relative to processes 201A-201N, as follows. While master process 201Z is performing rule checking using a given rule on the merged data, processes 201A-201N perform rule checking in their respective regions using a next rule that follows the given rule in the runset. Hence, in such pipelined embodiments of the invention, master process 201Z executes one rule behind processes 201A-201N.

Figure 1A:
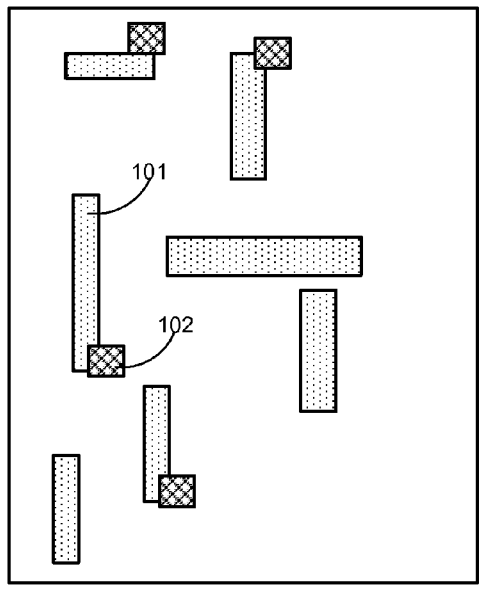
FIGS. 1A-1D illustrate a problem associated with prior art method of a verifying an IC design layout in individual regions, namely an upper region and a lower region.
Figure 1B:
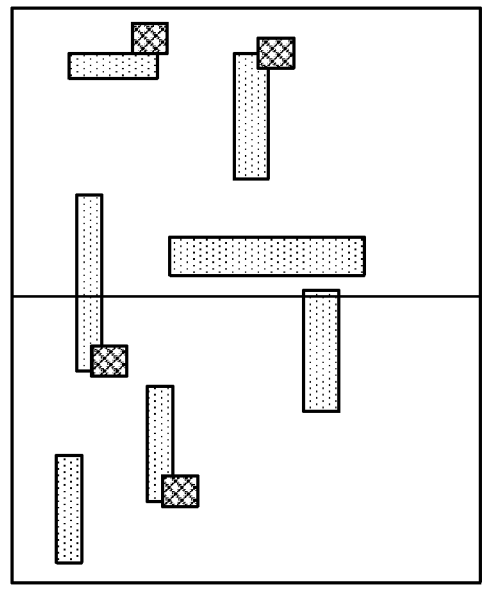
Figure 1C:
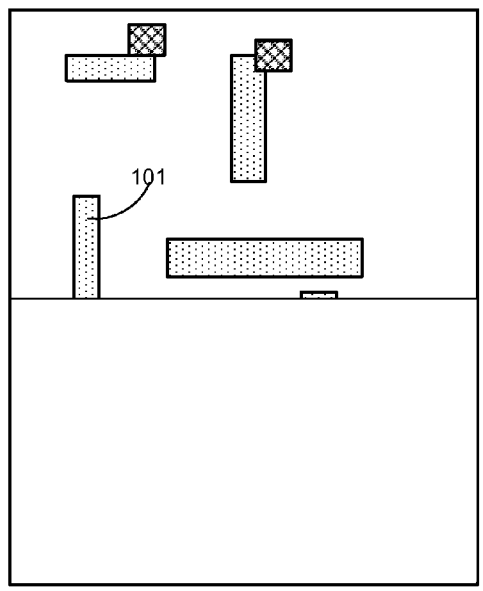
Figure 1D:
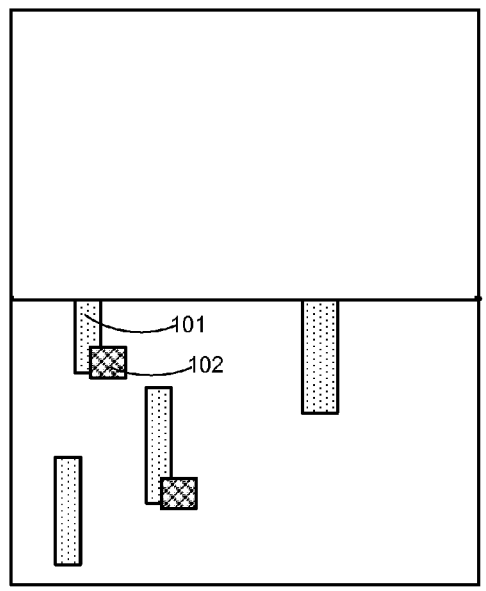
Figure 1I:
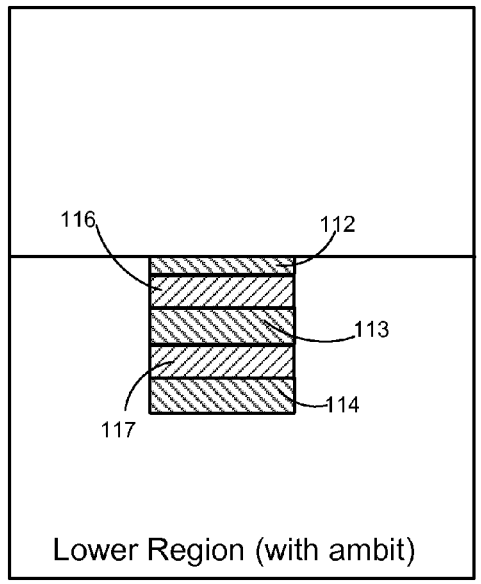
Figure 1J:
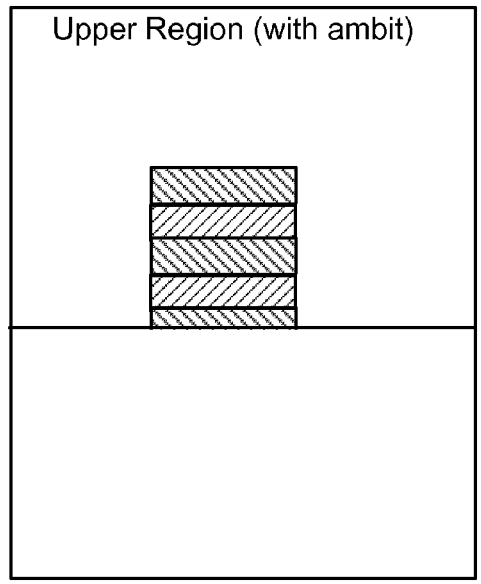
Figure 1K:
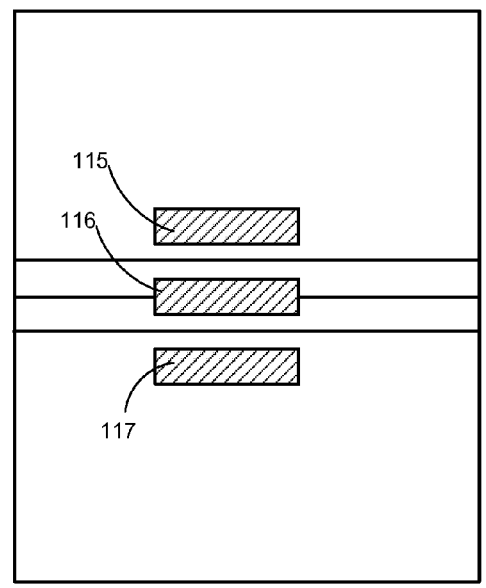
Figure 1L:
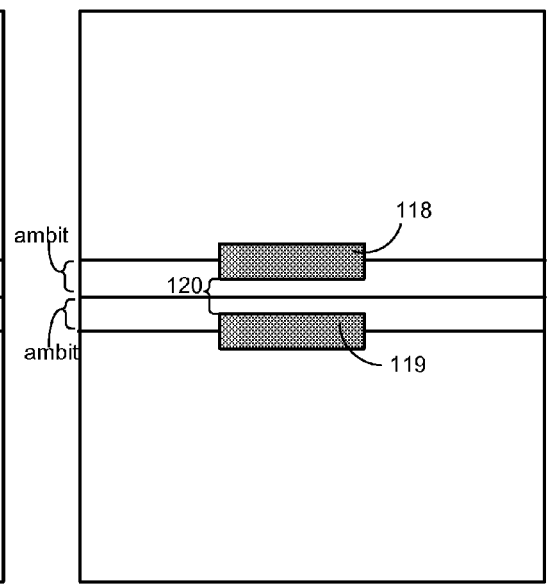
Figure 2A:
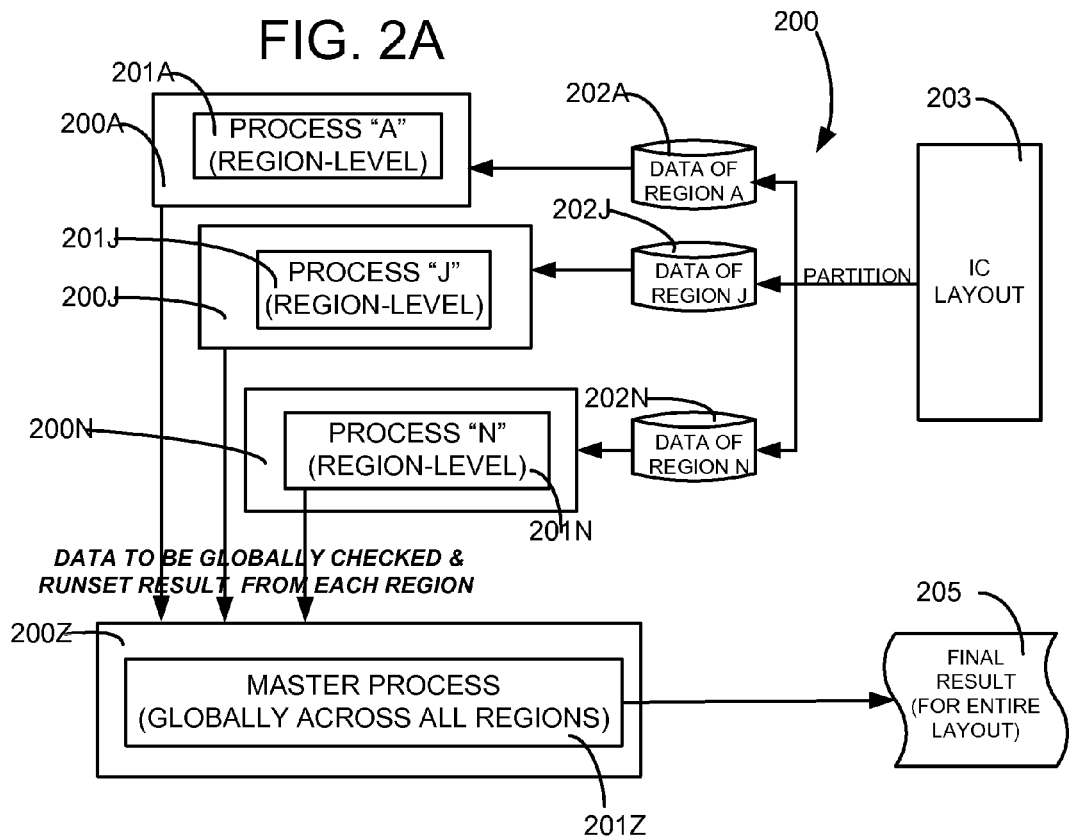
FIG. 2A illustrates, in a high-level block diagram, a system of one or more computers in accordance with the invention, that identify data to be propagated between rules in a given region as well as data to be verified globally across all regions.
Figure 2B:
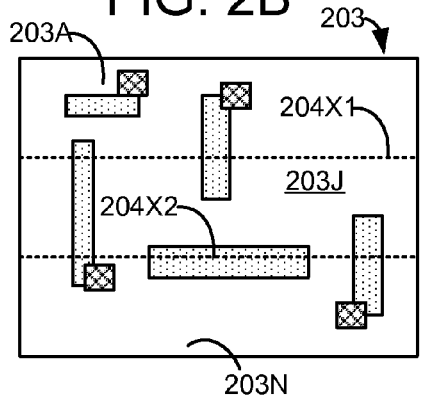
FIG. 2B illustrates a layout which has been subdivided into three regions, without regard to locations of features contained therein, in accordance with an act 212 illustrated in FIG. 2D.

In some embodiments, all of the rules in the runset are rule checked by processes 201A-201N and master process 201Z, and individual results, on completion of rule checking the entire runset, from processes 201A-201N (also called "runset results") are combined with the result of applying the runset to merged data by master process 201Z, to yield a final result 205 (FIG. 2A). In accordance with the invention, this final result 205 can be made identical to a corresponding result from execution of the runset over the entire IC layout without dividing the layout into regions, if region-level processes 201A-201N transfer appropriate to-be-globally-checked data to master process 201Z for every rule in the runset. The appropriate data to be transferred, from a region-level process to a master process, for each of a number of rules commonly used in a runset, is discussed in detail below, just before the claims.

In several embodiments, the total number of processes that work on a layout (i.e. region-level processes 201A-201N as well as master process 201Z) is selected to be equal to or an integral multiple of the total number of processors (e.g. CPUs) in computer system 200. In some embodiments there is no relation between these two numbers, i.e. number of processors and number of processes. Use of multiple processors that operate in parallel improves the speed at which an IC layout is verified.

In one embodiment, a three CPU computer system 200 is used as follows: two CPUs are used to execute two processes 201A and 201N on two halves of an IC layout, such as an upper region and a lower region into which the IC layout is evenly subdivided (i.e. partitioned), and the third CPU is used to execute master process 201Z. Other embodiments may use a computer system having an even number of CPUs, although an odd number has been discussed in this example.

In some embodiments, computer system 200 retrieves (see act 211 in FIG. 2D) an IC layout 203 to be verified, e.g. in the GDSII format, from an integrated circuit (IC) design database (such as, e.g. MILKYWAY) which holds a netlist produced by synthesis of a circuit description originally expressed in a hardware modeling language, such as VERILOG or VHDL. A design database is not shown in the attached figures or discussed below, because preparation of a layout from such a database is well known in the art. Any process in computer system 200 (such as master process 201Z) may be programmed to prepare IC layout 203 in the usual manner from such a database (which is located in persistent storage, such as a hard disk).

Figure 2C:
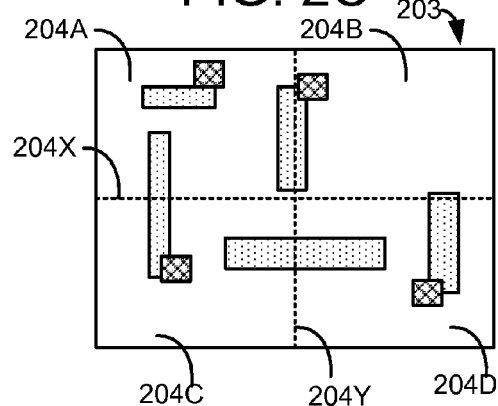
FIG. 2C illustrates the same layout as in FIG. 2B but now subdivided into four regions, also in accordance with an act 212 illustrated in FIG. 2D.
Figure 2D:
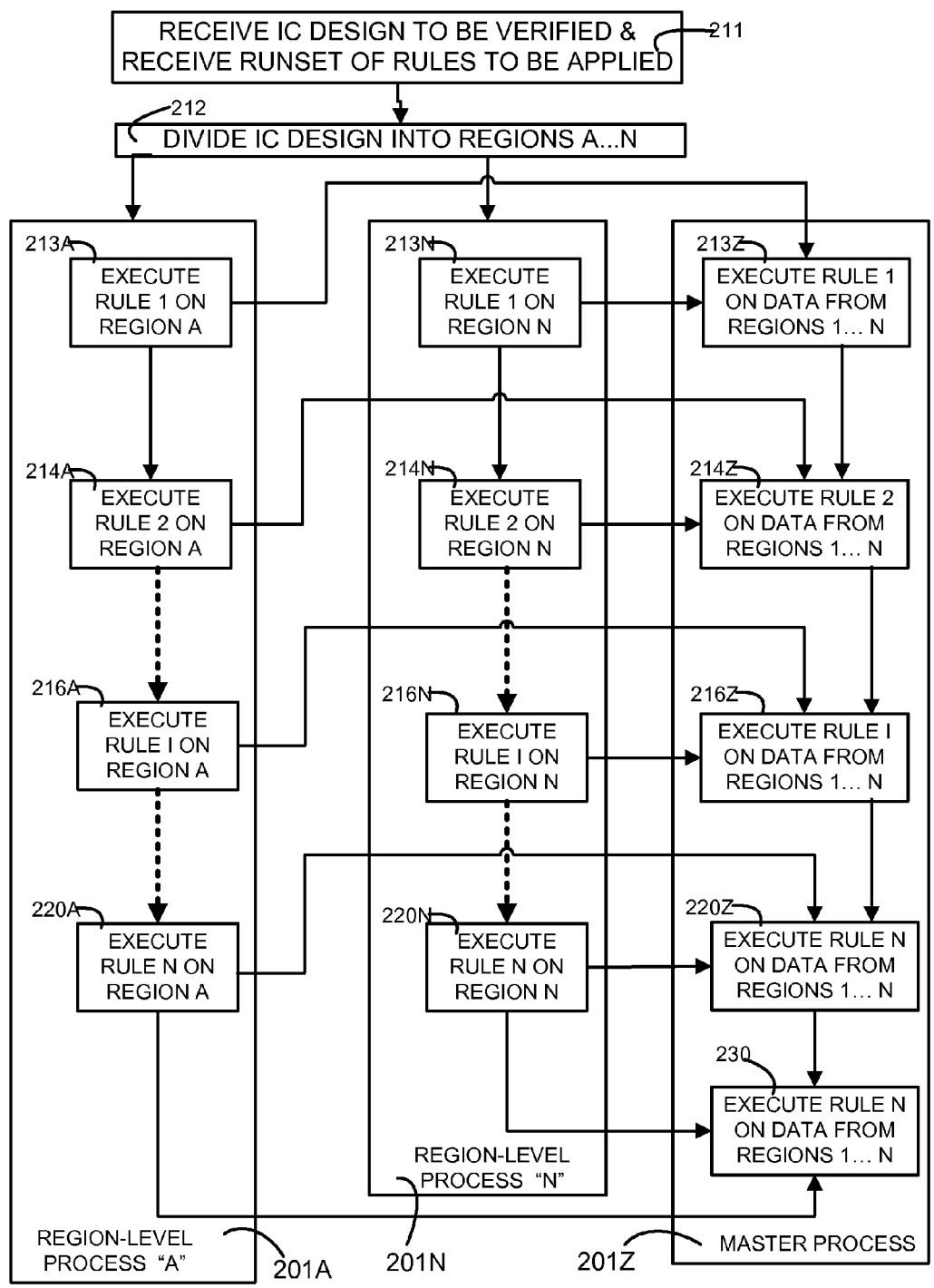
FIG. 2D illustrates, in a high-level flow chart, acts performed in some embodiments of the invention, by the system of FIG. 2A.

Thereafter, as illustrated by act 212 in FIG. 2D), layout 203 (FIG. 2A) is subdivided (i.e. partitioned) into a number of regions 203A-203N and each region 203J is stored in a corresponding storage unit 202J for rule checking by a corresponding region-level process 201J. Subdivision of a layout 203 may be performed in any conventional manner, either manually or automatically. In an illustration shown in FIG. 2B, an IC layout 203 is subdivided into three regions 203A, 203J and 203N that are to be rule checked by three processes 201A-201N respectively. The three regions 203A-203N are formed in layout 203 by inserting boundaries at horizontal lines 204X1 and 204X2 into layout 203.

In the embodiment illustrated in FIG. 2B, two horizontal lines 204X1 and 204X2 are evenly spaced from one another and from the respective top and bottom edges of the IC layout, thereby to partition the IC layout into three horizontal strips of equal width. The just-described subdivision is performed automatically by a fourth process 203Z that obtains the layout 203 from the database. In this example, each region-level process 201J is executed by a corresponding CPU, in a four-CPU computer system 200. Master process 210Z executes in the fourth CPU.

Figure 6A:
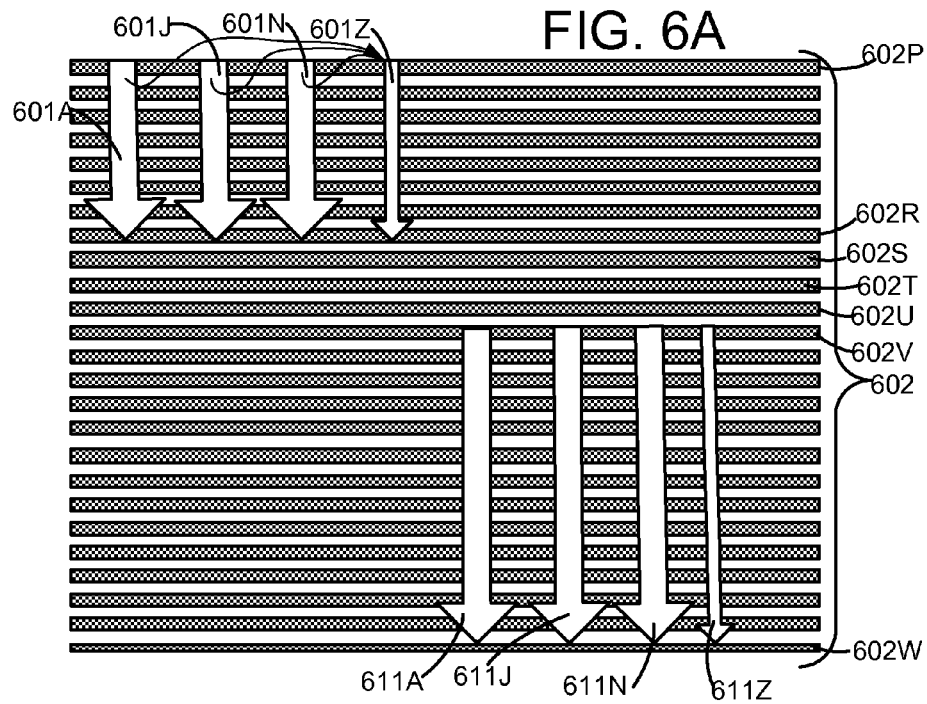
FIG. 6A illustrates a runset grouped into two groups of rules, wherein each group is separated from the other group by one or more rules that cannot be verified in individual regions.
Figure 6B:
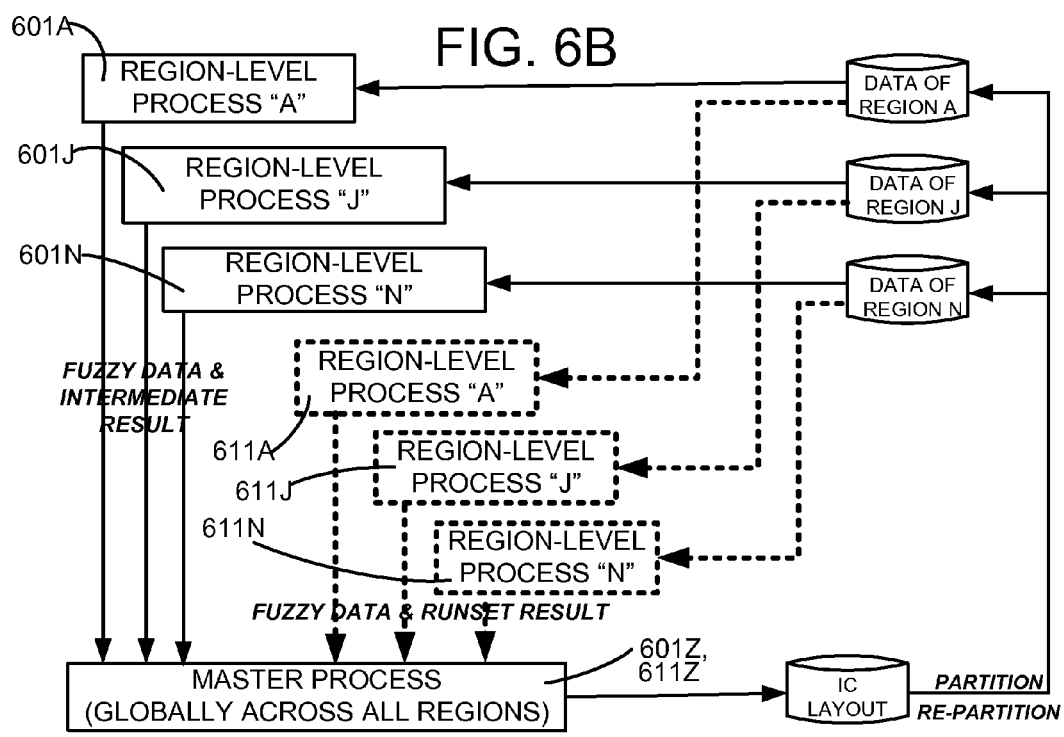
FIG. 6B illustrates, in a high-level block diagram, the system of computers of FIG. 2A, as used with multiple sequences of rules in the runset of FIG. 6A.
Figure 6C:
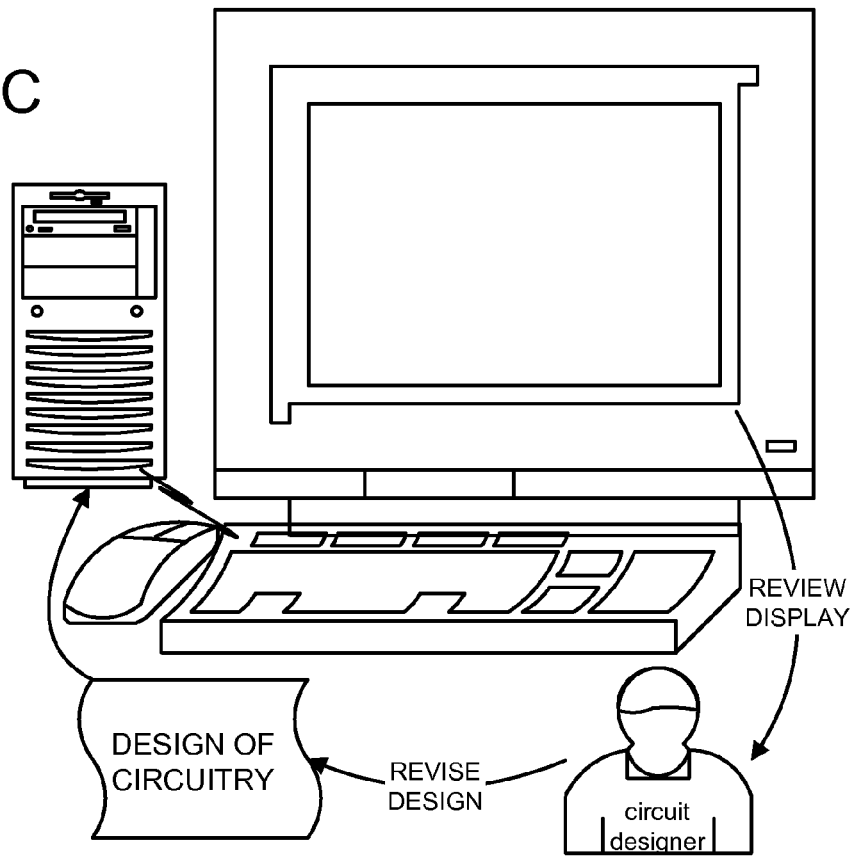
FIG. 6C illustrates a chip designer issuing commands via a runset file in a computer in one specific exemplary implementation of the invention.

In an embodiment illustrated in FIG. 2B, there are only two regions, namely an upper region 203A and a lower region 203B, and this subdivision is performed in accordance with a parameter of value 3×1 which is specified as an input in a file containing a runset, as illustrated in FIG. 6C. Note that if the value of this parameter is changed to 2×2 then the same IC design is subdivided into four quadrants by a vertical line 204Y and a horizontal line 204X. Note that in the embodiments shown in FIGS. 2B and 2C, the subdivision is done mechanically, without regard to the features that are being cut in the subdivision.

In one embodiment, a region-level process 201A performs an act 213A that executes a first rule in the runset on region 203A (FIG. 2B). On completion of act 213A, process 201A sends to-be-globally-checked data to master process 201Z that uses this data in act 213Z (discussed later). Similarly, process 201N performs act 213N that executes the first rule in the runset on region 203B. On completion of act 213N, process 201N also sends to-be-globally-checked data to master process 201Z for use in act 213Z. As there are only two regions, master process 201Z merges all of the to-be-globally-checked data from processes 201A and 201N, and thereafter act 213Z is performed to apply the first rule to the merged data.

While act 213Z is being performed, processes 201A and 201N proceed to perform their respective next acts 214A and 214N and wherein a second rule in the runset is executed on the respective regions 203A and 203B. As before, on completion of acts 214A and 214N, the respective processes 201A and 201N send to-be-globally-checked data to master process 201Z. If master process 201Z has completed performing act 213Z, the next act 214Z is performed to apply the second rule on the data merged from processes 201A and 201N. In this manner, execution proceeds within each of processes 201A, 201N and 201Z, until act 220Z is completed, which is then followed by performance of act 230 by master process 201Z. In act 230, master process 201Z combines the individual results of rule checking from each of processes 201A and 201N, with the result of rule checking from act 220Z to generate a final result, of rule checking IC layout 203.

In some embodiments, region-level processes 201A and 201N propagate certain data internally within each process (also called locally-unknown data). Locally-unknown data which is to be further checked within each region is propagated internally within each region-level process, from each act to the next act which is being performed within the region. This locally-unknown data is also referred to herein as a kind of "fuzzy" data. Hence, there are two kinds of fuzzy data, namely the locally-unknown data and the to-be-globally checked data. Both kinds of fuzzy data are used in most embodiments of the invention, although the specific formulation of each kind of fuzzy data may differ depending on the embodiment.

The region-level processes are illustrated in FIG. 3 as processes 301A and 301N. As illustrated by act 311A, a first rule is selected from the runset followed by performance of act 312A. In act 312A, region-level process 301A performs rule checking with the selected rule (at this stage the first rule) on region A and on any locally-unknown data propagated from the previous rule (at this stage there happens to be no such propagated data). Next, in act 313A, process 301A identifies the locally-unknown data which is propagated to the next rule. Thereafter, in act 314A, process 301A generates to-be-globally-checked data that is sent to master process 301Z. Next, in act 315A, process 301A checks to see if all of the rules in the runset have been used in rule checking region A, and if not it proceeds to act 316A. In act 316A, process 301A selects the next rule in the runset and returns to act 312A (described above).

If in act 315A, process 301A finds that the entire runset has been executed, then a result of performing the rule checking (also called runset result) for region A is sent to master process 301Z. Process 301N performs the same acts as a process 301A, except that these acts are performed on a region N instead of on region A. Master process 301Z merges the data received from each of processes 301A and 301N in act 331, followed by executing the selected rule on the merged data in act 332. Act 332 is followed by checking in act 333 if the runset has been completed. If not completed, process 301Z returns to act 331 (described above). If completed, process 301Z continues to act 334 and combines the runset results from processes 301A and 301N as well as the result from performance of act 332 to yield a final result. Note that master process 301Z does not perform the equivalent of acts 313A and 314A, because there are no boundaries in the master region, which has the size of the entire layout.

Figure 4E:
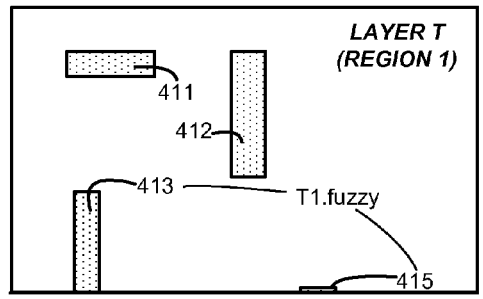

Rule checking of a layout example of FIGS. 4A-4B is performed in several embodiments of the invention as illustrated in FIGS. 4C-4L that are described below. Specifically, as illustrated in FIGS. 4A-4B, shapes of the layout are in three layers that are also referred to as red, green and blue. The red layer contains rectangles 411-417, the green layer contains rectangles 421-424 and the blue layer contains rectangles 431-434. The layout of FIG. 4A is subdivided in an even manner automatically, without any manual intervention, by performance of act 212 as shown in FIG. 4C resulting in two regions namely region 451 which is the upper half and region 452 which is the lower half with no overlap. A boundary line 453 is inserted into a layout 450 by some embodiments without regard to whether or not a feature is being cut up, resulting in upper half region 451 and lower half region 452. In this example, boundary line 453 is spanned by rectangles 413 and 415 that have respective portions present in each of the two regions 451 and 452. Note that boundary line 453 may be too close to a lower edge of rectangle 414 so as to violate a minimum spacing rule, but the subdivision of layout 450 is performed regardless of such considerations.

Assume that a first rule in the runset is to select all red rectangles that interact with green rectangles, and save the result in layer T. Therefore process 301A identifies red rectangles 411 and 412 due to their interaction with green rectangles 421 and 422, on completion of act 312A. Note that region 451 (FIG. 4C) is rule checked by process 301A. The locally-unknown data in region 451 for the RED layer is called RED1.fuzzy. The variable's name RED1.fuzzy is obtained by concatenating the name of the first layer in the current rule, the identifier of the region and the string ".fuzzy". RED1.fuzzy is an empty set when the rule checking process starts. For the same reason, GREEN1.fuzzy is also an empty set, because this is the starting point Next, after act 312A is performed, act 313A is performed to generate the locally-unknown data which is propagated to the next rule. In this example, the locally-unknown data is also identified to be rectangles 413 and 415 (FIG. 4E) which are same as the rectangles selected in act 314A, and they are selected for the same reason: because they span across boundary line 453 between regions 451 and 452. As noted above, the locally-unknown data is held in a variable of a name that is obtained by concatenating the resulting layer's name, an identifier of the region and the string ".fuzzy". Hence, in this example, a variable T1.fuzzy is used in act 313A, to identify the rectangles 413 and 414 that are to be locally checked in the next rule.

After act 313A is performed, act 314A is performed to generate the to-be-globally-checked data which is sent to master process 301Z. In this example, the to-be-globally-checked data is identified to be rectangles 413 and 415 (FIG. 4D) which are selected in act 314A because they span across boundary line 453 between regions 451 and 452. The to-be-globally-checked data is held in process 301A in a variable of a name that is obtained by concatenating the letters "cmd" with an identifier of the rule (e.g. 1, 2, 3 ...) in the runset, the string "_fuzzy", the name of the layer (e.g. RED, BLUE), and the identifier of the region (e.g. 1 for the upper region 451 and 2 for the lower region 452). In this example, a variable cmd1_fuzzyRED1 is used to identify this data that is to be globally checked. Note that here the variable cmd1_fuzzyGREEN1 is an empty set because no green rectangles interact with cmd1_fuzzyRED1 and RED1.fuzzy. In general both cmd1_fuzzyRED1 and cmd1_fuzzyGREEN1 are generated in region 451 and transferred to the master process 301Z.

Figure 4F:
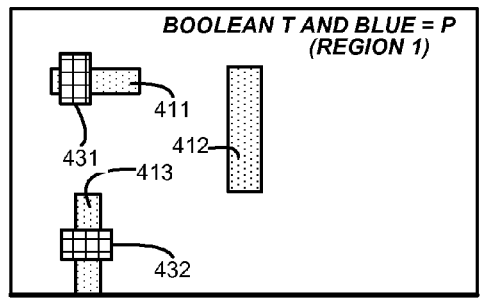
Figure 4G:
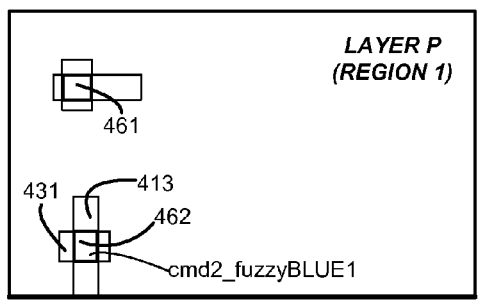

In this example, a second rule in the runset is to perform a Boolean "AND" operation between the result layer T from the first rule and the layer BLUE (see FIG. 4F). The result of performing rule checking with this second rule is to be saved in layer P. Therefore process 301A returns to act 312A and applies the second rule to layer T (containing rectangles 411 and 412) and also to variable T1.fuzzy (containing the rectangles 413 and 415). T1.fuzzy holds locally-unknown data propagated from the first rule. When performing rule checking with the second rule in the upper region of layer T, process 301A identifies an intersection 461 (FIG. 4G) between rectangles 411 and 431 as the result, which becomes the content of layer P. Additionally, in performing rule checking with the second rule on variable T1.fuzzy, process 301A also identifies another intersection 462 between rectangles 413 and 432 that becomes P1.fuzzy.

Figure 4H:
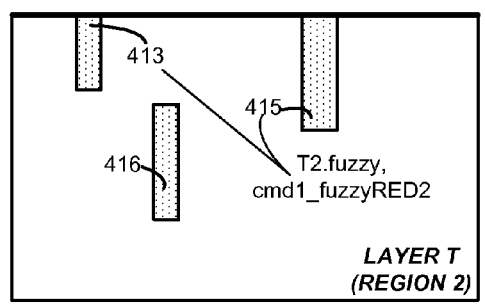
Figure 4I:
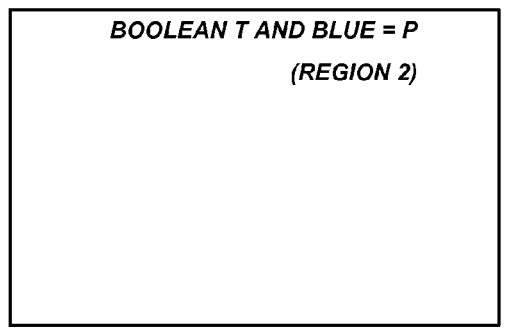
Figure 4J:
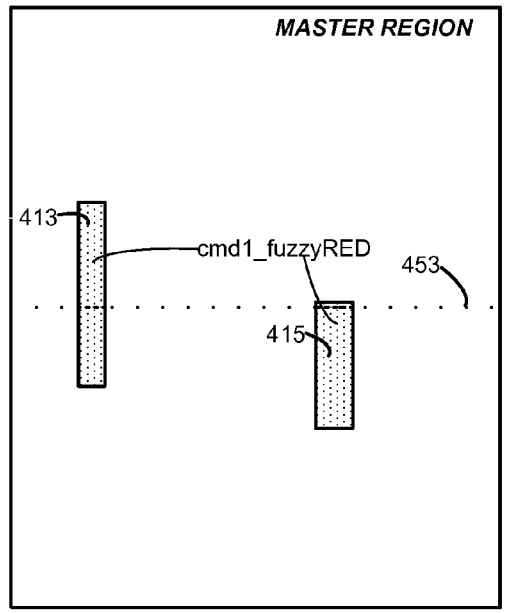
Figure 4K:
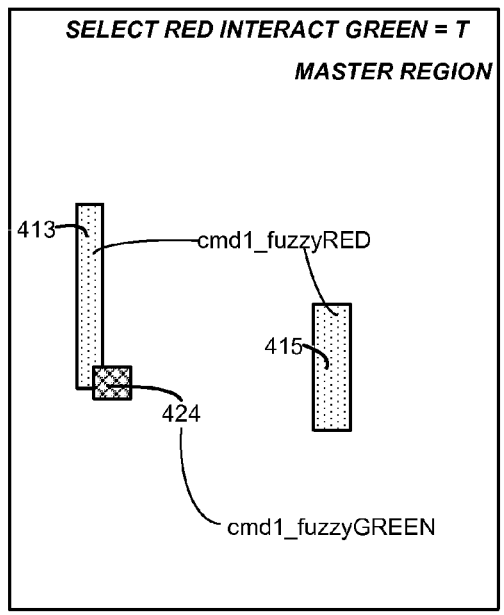

Next, after act 312A is performed, act 314A is performed to generate the to-be-globally-checked data which is sent to master process 301Z. In this example, the to-be-globally-checked data is identified to be rectangles 462 (FIG. 4G) which are selected as the intersection between rectangles 432 and 413. This to-be-globally-checked data is held in variable cmd2_fuzzyBLUE1. Note that to-be-globally-checked data for the layer T1 is empty, i.e. cmd2_fuzzyT1 is an empty set. Process 301N operates similar to process 301A, except that it operates on region 452, and identifies rectangle 416 as a shape in layer T (FIG. 4H). In addition, process 301N also identifies to-be-globally-checked data as rectangles 413 and 415 held in variable cmd1_fuzzyRED2 and rectangle 423 held in variable cmd1_fuzzyGREEN2. Variable T2.fuzzy is used to additionally identify this same data as the locally-unknown data to be propagated so that it can be locally checked by the next rule. During performance on this next rule, no shapes are added to the layer P and also no shapes are added to variable cmd2_fuzzyBLUE2 as shown in FIG. 4I.

Master process 301Z merges to-be-globally-checked data from each of processes 301A and 301N. In the example shown in FIG. 4J, rectangles 413 and 415 are reconstituted when shapes in variables cmd1_fuzzyRED1 and cmd1_fuzzyRED2 are merged. Note that the boundary line 453 does not exist in the master region shown in FIG. 4J. In this master region, the upper halves of rectangles 413 and 415 in upper region 451 are merged with their corresponding lower halves in lower region 452 (in a polygon merge operation of the type commonly available in a physical verification software product such as Hercules available from Synopsys, Inc.). Similarly, green rectangle 423 is obtained when shapes in variables cmd1_fuzzyGREEN1 and cmd1_fuzzyGREEN2 are similarly merged.

At this stage, the merged data includes rectangles 413, 415 and 423. In performing rule checking with the first rule on merged data, process 301Z identifies rectangle 413 that is added to the content of result layer T0. Therefore, layer T0 now stores rectangle 413. Note that the name T0 for the result layer in master process 301Z is obtained by concatenating a "0" (which denotes "master") at the end of the name of the layer as specified in the rule, which is T in this example (see FIG. 4K). Next, master process 301Z again merges to-be-globally-checked data from processes 301A and 301N, as provided in variables cmd2_fuzzyBLUE1 and cmd2_fuzzyBLUE2. As noted above, variable cmd2_fuzzyBLUE2 is empty, and variable cmd2_fuzzyBLUE1 contains rectangle 462 which therefore becomes the merged data at this stage. Hence, master process 301Z now performs rule checking using the second rule, on the merged data (rectangles 413 and 462) and on layer T (rectangle 413).

Figure 4L:
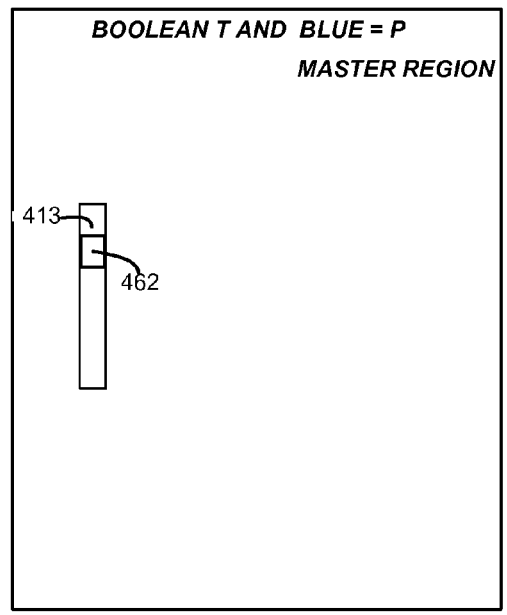

The result of applying the second rule is that layer P0 contains a rectangle 462 (FIG. 4L). At this stage, the runset results for the regions 451 and 452, which are stored in result layer P, are received from region-level processes 301A and 301N, and are combined with result from rule checking the merged data within master process 301Z, to yield a final result (in this case only the two rectangles 461 and 462 are obtained, when the various results are merged).

Figure 5A:
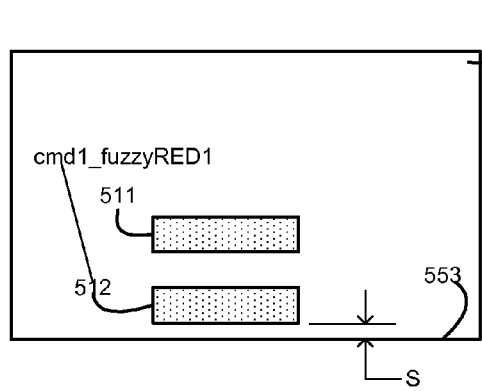

The method of FIG. 3 is now described in the context of the example of FIG. 1G-1L, as now illustrated in FIGS. 5A-5L. specifically, as shown in FIG. 5A, region-level process 301A operates on region 551. In this example, two red rectangles 511 and 512 are checked to see if a minimum spacing S is maintained from boundary line 553. Any rectangle, such as rectangle 512 that violates this minimum spacing requirement S is added to a variable cmd1_fuzzyRED1, which is sent as to-be-globally-checked data to master process 301Z.

Figure 5B:
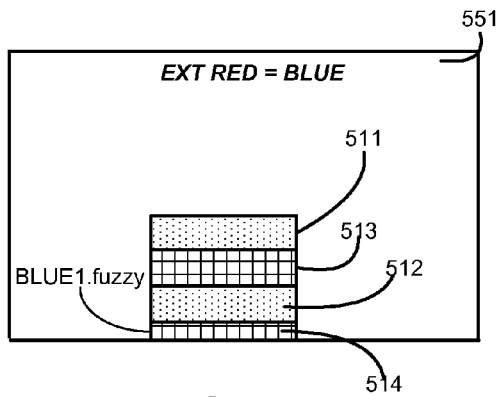

A first rule in the runset in this example is EXT RED=BLUE. This first rule means that any shape within distance S of a red rectangle is to be placed in the layer BLUE. When this first rule is applied to region 551, the result is a blue rectangle 513, which as shown in FIG. 5B is located between red rectangles 511 and 512. Also as shown in FIG. 5B, a blue rectangle 514 is now formed between red rectangle 512 and boundary line 553, and rectangle 514 is stored in variable BLUE1.fuzzy. This variable BLUE1.fuzzy holds locally-unknown data for use in process 301A when performing rule checking in region 551 using the second rule in the runset.

Figure 5C:
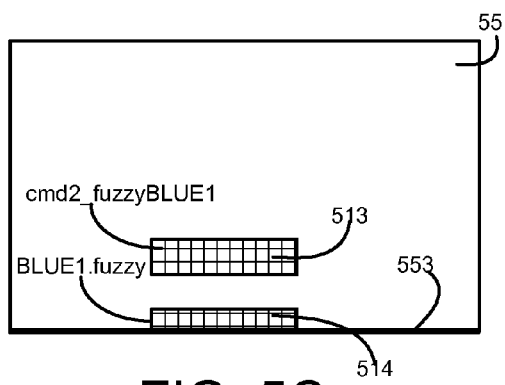
Figure 5D:
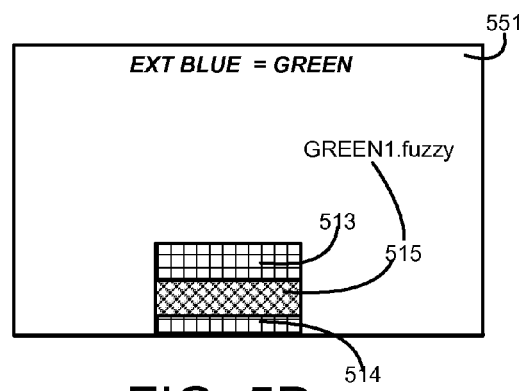
Figure 5I:
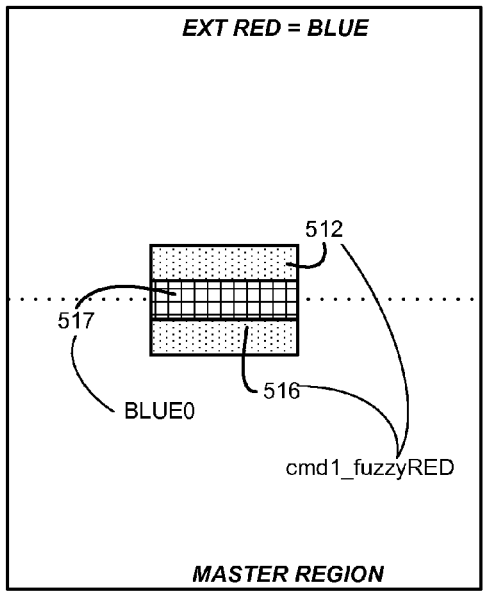

At this stage, process 301A generates to-be-globally-checked data for the second rule in the runset by working on the blue layer which contains two rectangles 513 and 514 as shown in FIG. 5C. Specifically, in applying the minimum spacing requirement S, rectangle 513 is found to be too close to BLUE1.fuzzy and therefore rectangle 513 is stored in the variable cmd2_fuzzyBLUE1, which is sent as to-be-globally-checked data to master process 301Z.

A second rule in the runset of this example is EXT BLUE=GREEN. Therefore process 301A a now identifies rectangle 515 (see FIG. 5D) located between blue rectangles 513 and 514, as being saved in variable GREEN1.fuzzy. This variable GREEN1.fuzzy holds locally-unknown data for use in process 301A when performing rule checking in region 551 using the third rule in the runset. A third rule in the runset of this example is EXT GREEN, and the result of which happens to be empty. The reason that the result of third rule, EXT GREEN, is empty is that there is only one green rectangle 515 in FIG. 5D. This rectangle 515 which is in the variable GREEN1.fuzzy, and there are no other shapes in the layer GREEN in region 551. Therefore, the variable cmd3_fuzzyGREEN1 is empty.

As shown in FIGS. 5F-5G, process 301N performs rule checking in region 552 in a manner similar or identical to that described above in reference to process 301A. Moreover, master process 301Z merges the data it receives from processes 301A and 301N, for example to create two red rectangles 512 and 516 (FIG. 5H) for use in performing rule checking using the first rule in the runset. Specifically, a variable cmd1_fuzzyRED is obtained from the merger of shapes in variables cmd1_fuzzyRED1 and variable cmd1_fuzzyRED2. Thereafter, on applying the first rule in the master region, process 301Z identifies a new rectangle 517 (located between rectangles 512 and 516) as the result BLUE0 (see FIG. 5I).

Figure 5J:
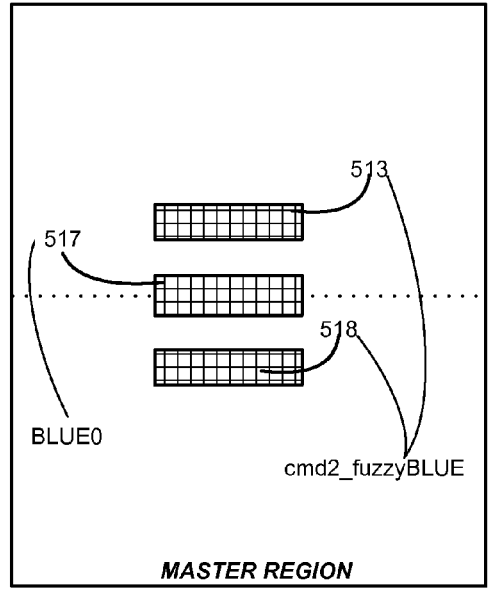
Figure 5K:
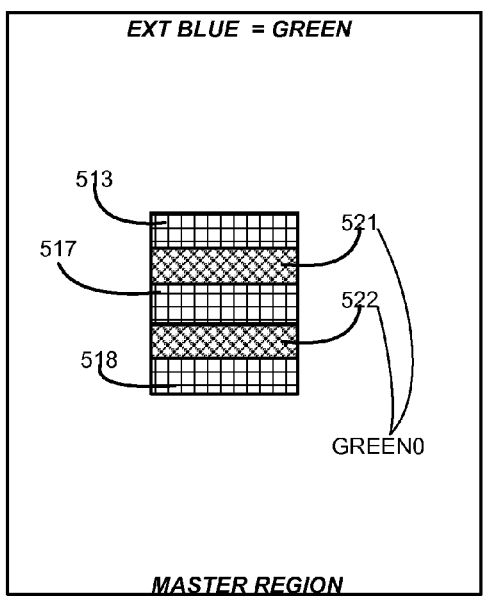
Figure 5L:
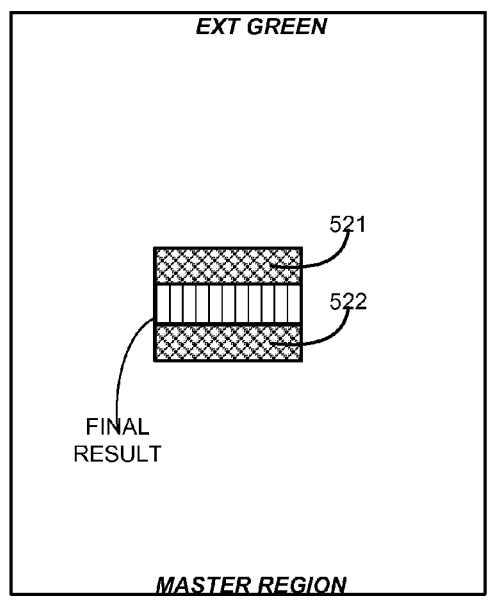

Next, master process 301Z merges the to-be-globally-checked data from processes 301A and 301N, to obtain rectangles 513 and 518 (as shown in FIG. 5J.). Thereafter, master process 301Z performs rule checking on the three rectangles 513, 517 and 518 using the second rule, i.e. EXT BLUE=GREEN. Two rectangles 531 and 522 are identified as the result of applying this second rule, and are stored in variable GREEN0 as shown in FIG. 5K. Thereafter, master process 301Z merges the to-be-globally-checked data from processes 301A and 301N, and obtains an empty set at this stage. Finally, master process 301Z applies the third rule on the runset, namely EXT GREEN, obtain a final result. Note that rectangle 523 which is the final result (FIG. 5L), is a nonempty set, unlike the prior art shown above in reference to FIG. 1L.

Note that although in some embodiments, all rules in a runset are rule-checked by region-level processes, runsets of other embodiments use one or more rules for which it is unknown as to how to prepare the appropriate to-be-globally-checked data and/or locally-unknown data. In such other embodiments, the region-level processes are used only to rule-check those rules for which it is known how to prepare the appropriate to-be-globally-checked data and locally-unknown data (together referred to as "fuzzy" data), and the remaining rules are rule-checked in a conventional manner (e.g. on a global scale without regions, or on a local scale with regions having ambits).

Specifically, as illustrated in FIG. 6A, a runset 602 contains a sequence of rules 602P-602R for which it is known how to prepare the fuzzy data, followed by a sequence of rules 602S-602U for which it is unknown how to prepare fuzzy data, followed by a sequence of rules 602V-602W for which it is known how to prepare the fuzzy data. In this example, the initial sequence of rules 602P-602R for which fuzzy data preparation is known are treated as a complete runset as described above, with region-level processes 601A-601N and master process 601Z being used to rule check all rules in this initial sequence. Thereafter, the result from this initial sequence (also called "intermediate result") from combining as discussed above, is used to rule check the intermediate sequence of rules 602S-602U in the conventional manner, (e.g. by any conventional method that uses the entire IC layout without partitioning). Hence, this intermediate sequence is rule checked without the benefit of multiple processors (and in the embodiment illustrated in FIG. 6B, this is done within the master process itself). The result of rule checking in the conventional manner is then re-partitioned and used to rule check the final sequence of rules 602V-602W, in the above-described manner, with region-level processes 611A-611N and master process 611Z being used to rule check all rules in this final sequence.

Figure 6D:
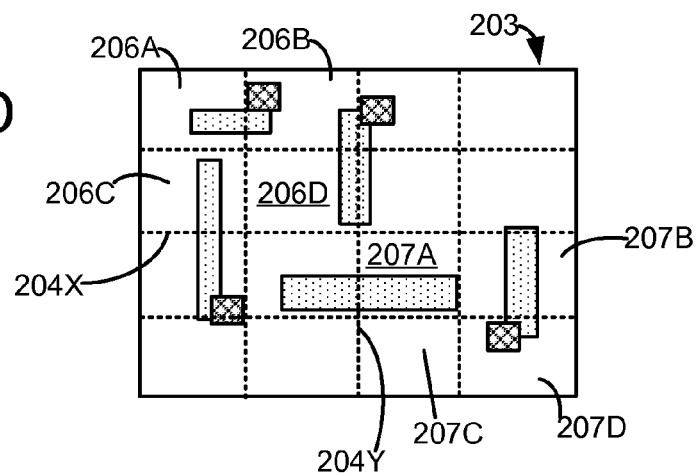
FIG. 6D illustrates the same layout as in FIG. 2B but now subdivided into sixteen regions, also in accordance with an act 212 illustrated in FIG. 2D.

FIG. 6C illustrates a chip designer issuing commands via a runset file in a computer in one specific exemplary implementation of the invention. Note that the commands identify, for example, the number of regions and the manner in which a layout is to be subdivided, e.g. by specifying 3×1 or 2×2 as illustrated in FIGS. 2B and 2C as discussed above. Furthermore, the same layout may be divided into sixteen regions, e.g. by in response to a command containing the parameter 4×4 as illustrated in FIG. 6D. Note further that in one embodiment a method of the type described above is performed in a hierarchical manner, wherein multiple groups of processes supply to-be-globally-checked data from each group to a respective process (hereinafter "intermediate-master" process), and each intermediate-master process in turn supplies to-be-checked data to the master process. Such a hierarchy of processes can have any level of depth depending on the embodiment, although for illustrative purposes a two level hierarchy is illustrated in FIG. 6D which is discussed next.

Specifically, in the example shown in FIG. 6D, four region-level processes perform rule checking in the respective four regions 206A-206D and supply the to-be-globally-checked data from each of these regions to an intermediate-master process 206 (not shown in FIG. 6D) that merges the data it receives and performs rule checking on this merged data e.g. in the top left quadrant 204A (see FIG. 2C). This process 206 in turn generates to-be-globally-checked data that interact with lines 204X and 204Y at the boundaries of quadrant 204A. Similarly, four region-level processes that perform rule checking in regions 207A-207D supply their respective to-be-globally-checked data to another intermediate-master process 207 (not shown in FIG. 6D) that merges the data it receives and performs rule checking on this merged data e.g. in the bottom right quadrant 204D (see FIG. 2C). This process 207 in turn generates to-be-globally-checked data that interact with lines 204X and 204Y at the boundaries of quadrant 204D. The to-be-globally-checked data from these two intermediate-master processes 206 and 207 as well as from two additional intermediate-master processes (for the quadrants 204B and 204C shown in FIG. 2C) is all merged by a single master process that receives data from all four quadrants.

In some embodiments, the merged data may be sufficiently large as to require a computer in which the master process executes to have a large memory and/or a fast CPU as compared to the computers in which region-level processes execute (regardless of the depth of hierarchy). In such embodiments, a master process may be programmed perform the above-described method recursively, e.g. by subdividing the merged data into data for individual regions, followed by rule checking in the individual regions (on each individual merged data portion related to the corresponding region), followed by re-merging the to-be-globally-checked data. While some embodiments subdivide the merged data in the same manner (e.g. into the same regions) as the subdivision of the IC layout, other embodiments subdivide the merged data into larger regions. In an example illustrated in FIG. 6D, if the hierarchy is just one (i.e. there are no intermediate-master processes), the IC layout is subdivided into 16 regions while the merged data therefrom is subdivided into 4 regions.

It may be helpful to place the above-described process in context. FIG. 7 shows a simplified representation of an exemplary digital ASIC design flow. At a high level, the process starts with the product idea (700) and is realized in a EDA software design process (710). When the design is finalized, it can be taped-out (event 740). After tape out, the fabrication process (750) and packaging and assembly processes (760) occur resulting, ultimately, in finished chips (result 770).

The EDA software design process (710) is actually composed of a number of stages 712-730, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 710) will now be provided.

System design (stage 712): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 714): At this stage, the VHDL or Verilog code for modules in the system is written and the design (which may be of mixed clock domains) is checked for functional accuracy. More specifically, does the design as checked to ensure that produces the correct outputs. Exemplary EDA software products from Synopsys, Inc. that can be used at this stage include VCS, VERA, DesignWare®, Magellan, Formality, ESP and LEDA products.

Synthesis and design for test (stage 716): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 718): Here, an overall floorplan for the chip is constructed and analyzed for timing and top-level routing. Exemplary EDA software products from Synopsys, Inc. that can be used at this stage include Jupiter and Floorplan Compiler products.

Netlist verification (stage 720): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 722): The placement (positioning of circuit elements) and routing (connection of the same) occurs at this step. Exemplary EDA software products from Synopsys, Inc. that can be used at this stage include the Astro product.

Analysis and extraction (stage 724): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 726): At this stage various checking functions are performed to ensure correctness for: manufacturing, electrical issues, lithographic issues, and circuitry. Exemplary EDA software products from Synopsys, Inc. that can be used at this include the Hercules product. Note that various acts of the type described above in reference to FIG. 3 are performed in a stage 726A that is reached from this stage, in some embodiments of the invention. Hence, although circuitry and portions thereof (such as rectangles) may be thought of at this stage as if they exist in the real world, it is to be understood that at this stage only a layout exists in a computer system 200 (FIG. 2A). The actual circuitry in the real world is created after this stage as discussed below.

Resolution enhancement (stage 728): This involves geometric manipulations of the layout to improve manufacturability of the design. Exemplary EDA software products from Synopsys, Inc. that can be used at this include iN-Phase, Proteus, and AFGen products.

Mask data preparation (stage 730): This provides the "tape-out" data for production of masks for lithographic use to produce finished chips. Exemplary EDA software products from Synopsys, Inc. that can be used at this include the CATS(R) family of products. Note that various acts of the type described above in reference to FIG. 3 may also be performed in a stage 730A that is accessed from this stage, in some embodiments of the invention. It is to be understood that even at this stage only a computer model exists in a computer system 200 (FIG. 2A). The actual circuitry in the real world is created after this stage in a wafer fabrication facility (also called "fab").

The data structures and software code for implementing one or more acts described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In one embodiment, the carrier wave includes computer instruction signals for carrying out one or more steps performed by one or more region-level processes 201A-201N and/or master process 201Z of FIG. 2A.

Note that a computer system used in some embodiments to implement a rule-checker of the type described herein uses ninety linux operating system workstations (based on IBM-compatible PCs) each containing a 2 GHz CPU and 1 GB memory, that are interconnected via a local area network (Ethernet).

Appropriate to-be-globally-checked data that is transferred by each region-level process to the master process depends on the rule, examples of which are discussed below. If a rule has an operator OP and two operands namely a first layer $Ai$ and a second layer $Bi$ wherein "i" denotes a region, then a region-level process produces four outputs, namely $Ci$ which is the result, $Ci.fuzzy$ which is the locally-unknown data for use in the next rule, and $cmd\_FuzzyAi$ and $cmd\_FuzzyBi$ which are the to-be-globally-checked data for each of two layers, as follows.

$$(Ai,Ai.fuzzy)OP(Bi,Bi.fuzzy)=(Ci,Ci.fuzzy)$$

$$(Ai,Ai.fuzzy)OP(Bi,Bi.fuzzy)=(cmd\_FuzzyAi,cmd\_FuzzyBi)$$

Note that the variable name of the to-be-globally-checked includes a subscript (such as "1" or "3") immediately following the term "cmd" in the above equation, to identify a rule in whose application the data gets generated, as illustrated in FIG. 4D for example by the name cmd1_fuzzyRED1.

The master process merges the to-be-globally-checked data from multiple regions, one layer at a time, as follows.

$$cmd\_FuzzyA1+cmd\_FuzzyA2+\ldots=cmd\_FuzzyA$$

$$cmd\_FuzzyB1+cmd\_FuzzyB2+\ldots=cmd\_FuzzyB$$

In the above equations, the numbers "1" and "2" denote region numbers whereas "A" and "B" denote layer names. Note that the "+" operand shown above denotes a polygon merge. After merging, the merged data in each layer is used with a respective result in each layer from performing rule checking using the last rule, to perform rule checking using the current rule as follows.

$$(A0,cmd\_FuzzyA)OP(B0,cmd\_FuzzyB)=C0$$

If the current rule is the last rule, then the results are combined as shown below.

$$C0+C1+C2+\ldots+Cn=C$$

In the above-listed equation as well, the "+" operand denotes merging of polygons in any conventional manner. Note that $C0$ is the result from rule-checking by the master process, while $C1$ to $Cn$ are results of rule checking by individual region-level processes.

Examples of specific rules and appropriate fuzzy data, namely to-be-globally-checked data and locally-unknown data that are generated and propagated in some embodiments of the invention are now discussed. A first example is for rule BOOLEAN A AND C=D, wherein "AND" denotes intersection (i.e. overlap) between shapes in layers A and C, some embodiments generate to-be-globally-checked data as follows:

$$cmd\_FuzzyAi=Ai\ AND\ Ci.fuzzy$$

$$cmd\_FuzzyCi=Ci\ AND\ Ai.fuzzy$$

Note that in the above equations, $Ci.fuzzy$ and $Ai.fuzzy$ are the locally-unknown data propagated from the previous rule, and $Ai$ and $Ci$ are the results of performing rule checking using the previous rule (or initially just the layout from the database which has been subdivided). Moreover, in applying this rule, the result is obtained in the normal manner, namely $Di=Ai\ AND\ Ci$. In addition, the locally-unknown data which is to be propagated to the next rule is as follows:

$$Di.fuzzy=cmd\_FuzzyAi+cmd\_FuzzyCi+(Ai.fuzzy\ AND\ Ci.fuzzy)$$

A second example is for rule SELECT A INTERACT B=C wherein "INTERACT" checks if shapes in layer A interact with shapes in layer B and the result is stored in C. When performing this rule, some embodiments generate to-be-globally-checked data as follows:

$$newFuzzyAi=Ai\ INTERACT\ Boundary$$

$$cmd\_FuzzyAi=newFuzzyAi+Ai\ INTERACT\ Ai.fuzzy+Ai\ INTERACT\ Bi.fuzzy$$

$$cmd\_FuzzyBi=Bi\ INTERACT(newFuzzyAi+Ai\ INTERACT\ Ai.fuzzy)$$

In the first equation listed above, "newFuzzyAi" is a temporary variable, and "Boundary" is the location of a boundary line (or multiple boundary lines if more than one line is used to form regions). In addition, in applying this rule, the result is obtained as follows:

$$Ci=(Ai\ NOT\ newFuzzyAi)INTERACT\ Bi$$

In addition, the locally-unknown data which is to be propagated to the next rule is as follows:

$$Ci.fuzzy=Ai.fuzzy+cmd\_FuzzyAi$$

A third example is for rule EXTERNAL A=C, which is similar to the above-described second example, except that in this rule an external spacing check is performed, as discussed next. Specifically, violation of a minimum spacing requirement by any shapes in layers A is checked, with the result being stored in C. When performing this rule, some embodiments use the following equations, wherein tmpC is a temporary variable:

$$tmpC=EXTERNAL(A,A)$$

Note that the above equation requires checking the minimum spacing between two polygons of layer A.

$$tmp=SELECT\ tmpC\ INTERACT\ Ai.fuzzy$$

$$C=tmpC\ NOT\ tmp$$

$$Ci.fuzzy=EXTERNAL(A,Boundary)+EXTERNAL(A,Ai.fuzzy)$$

Note that the above equation requires checking the minimum space S between a polygon of layer A and the boundary line and flagging that in-between space if it is too close (i.e. if it is less than S).

$$cmd\_FuzzyAi = \text{data of } A \text{ that is within space } S \text{ to Boundary} + \text{data of } A \text{ that is within space } S \text{ to } Ai.\text{fuzzy}$$

Above-listed equation outputs all polygons of A that are closer than space S to the boundary line and also all polygons of A that are closer than space S to a polygon in Ai.fuzzy.

A fourth example is for rule INTERNAL A=C, which is similar to the above-described third example, except that in this rule an internal width check is performed, as discussed next. Specifically, violation of a minimum width requirement by any shapes in layers A is checked, with the result being stored in C. When performing this rule, some embodiments use the following equations, wherein tmpC is a temporary variable:

$$tmpC = \text{INTERNAL}(A)$$

Note that the above equation requires checking the minimum width W on a polygon of layer A.

$$tmp = \text{SELECT } tmpC \text{ INTERACT } Ai.\text{fuzzy} + \text{SELECT } tmpC \text{ INTERACT Boundary}$$

$$C = tmpC \text{ NOT } tmp$$

$$Ci.\text{fuzzy} = Ai.\text{fuzzy} + tmp$$

$$cmd\_FuzzyAi = \text{data of } A \text{ that is within width } W \text{ to Boundary} + \text{data of } A \text{ that is within width } W \text{ to } Ai.\text{fuzzy}$$

Above-listed equation outputs all polygons of A that are closer than width W to the boundary line and also all polygons of A that are than width W to a polygon in Ai.fuzzy.

Note that the above equations provide a sufficient set of rules for Design Rule Checking (DRC), as will be apparent to the skilled artisan. Specifically, any DRC rule not explicitly identified in the above equations can be expressed in terms of two or more of the above equations. For example, SELECT A INSIDE B=C is the equivalent to the following:

A NOT B=D

SELECT A INTERACT D=E

A NOT E=C

Numerous modifications and adaptations of the embodiments described herein will become apparent to the skilled artisan in view of this disclosure. Hence, although some embodiments have been described above for the Hercules tool available from Synopsys, Inc, other embodiments use other tools, such as Hera tool available from IBM Corporation and Moat tool available from Texas Instruments.

Although in some embodiments, boundary line 453 between regions 451 and 452 is inserted without regard to the locations of features in layout 450, one or more such boundary line(s) may alternatively be routed through layout 450 to minimize the number of features being cut up or to minimize violation of minimum spacing requirements. Such alternative embodiments reduce the amount of to-be-globally-checked data being sent to master process 301Z, and therefore the amount of processing performed by (and the amount of CPU and memory resources consumed by) process 301Z.

In some embodiments discussed above, the number of region-level processes 201A-201N is equal to the number of regions into which a single IC layout is partitioned. However, other embodiments may have more regions than processors in computer system 200 (e.g. if one or more processors work on multiple regions sequentially), or fewer regions than processors (e.g. if one or more regions is idle). Also, rules that are checked by region-level processes of the type described above can be any design check rules (DRC) or mask check rules (MRC), so long as techniques for generation of to-be-globally-checked data and for propagation of locally-unknown data are programmed into the region-level processes.

Furthermore, although in some embodiments, region-level processes 201A-201N operate in a pipelined manner relative to master process 201Z, in alternative embodiments the region-level processes supply "to-be-globally-checked" data to the master process ahead of time, prior to execution of each rule, and in these embodiments the region-level processes and the master process all execute simultaneously (or substantially simultaneously) with one another on generating the output of a given rule, as described above in reference to FIGS. 5A-5L.

Note also that although certain syntax for rule checking commands has been illustrated herein, other syntax is used in other embodiments. For example, instead of the command A NOT B=D, one alternative embodiment may use the command D=A NOT B while another alternative embodiment may use the command D=Boolean NOT (A, B). The specific syntax of rule checking commands is not a critical aspect of the invention.

Note further that although some embodiments perform rule checking as discussed above, other embodiments perform any other verification operation, such as layout versus schematic (LVS) verification (wherein a design layout is compared to a netlist that describes interconnections of components), and optical process correction (OPC) wherein a reticle layout is modified according to a fixed set of rules). In such embodiments, one kind of fuzzy data is propagated locally within the region for use in one or more verification operation(s), while the other kind of fuzzy data is transferred from multiple regions to a common process that merges the received data and performs the same verification operation(s) on the merged data.

The following Appendix A contains an illustrative exemplary runset for execution in the Hercules tool. Moreover, the following Appendix B contains results of execution of the Hercules tool using the runset of Appendix A.

Numerous modifications and adaptations of the embodiments described herein are encompassed by the scope of the invention.

```
1    APPENDIX A
2    BOOLEAN EXCLI NOT SRM { } TEMP=excl
3    BOOLEAN excl OR SRM { } TEMP=excl_srm
4    SELECT M2I INSIDE excl { }TEMP=M2I_INS_excl1
5    SELECT M2I OUTSIDE M2I_INS_excl1 { }TEMP=m2
6    SELECT VIA2I INSIDE excl { }TEMP=VIA2I_INS_excl1
7    SELECT VIA2I OUTSIDE VIA2I_INS_excl1 { }TEMP=via2
8    SELECT M3I INSIDE excl { }TEMP=M3I_INS_excl1
```

```
 9  SELECT M3I OUTSIDE M3I_INS_excl1 { }TEMP=m3
10  BOOLEAN FWI NOT excl_srm { } TEMP=fw
11  BOOLEAN PMDMY NOT fw { } TEMP=rngx
12  BOOLEAN rngx OR SEALRING { } TEMP=via_exd
13  BOOLEAN via2 NOT via_exd { } TEMP=via2_exd
14  SIZE m2 { UNDER_OVER=0.21
15      CLIP_ACUTE=TRUE } TEMP=m2wide_042_098
16  SIZE m2wide_042_098 { UNDER_OVER=0.49
17      CLIP_ACUTE=TRUE } TEMP=m2wide_098
18  SIZE m3 { UNDER_OVER=0.21
19      CLIP_ACUTE=TRUE } TEMP=m3wide_042_098
20  SIZE m3wide_042_098 { UNDER_OVER=0.49
21      CLIP_ACUTE=TRUE } TEMP=m3wide_098
22  BOOLEAN m2wide_042_098 AND m3 { } TEMP=wide_mx_042_098
23  BOOLEAN m3wide_042_098 AND m2 { } TEMP=wide_mx1_042_098
24  BOOLEAN wide_mx_042_098 OR wide_mx1_042_098 { }
25  TEMP=wide_042_098
26  SELECT m2 INTERACT m2wide_042_098 { }TEMP=mx_with_skinny
27  BOOLEAN mx_with_skinny NOT m2wide_042_098 { } TEMP=skinny_mx
28  SELECT m3 INTERACT m3wide_042_098 { }TEMP=mx1_with_skinny
29  BOOLEAN mx1_with_skinny NOT m3wide_042_098 { } TEMP=skinny_mx1
30  BOOLEAN skinny_mx OR skinny_mx1 { } TEMP=skinny_mxmx1
31  BOOLEAN m2wide_098 AND m3 { } TEMP=wide_mx_098
32  BOOLEAN m3wide_098 AND m2 { } TEMP=wide_mx1_098
33  BOOLEAN wide_mx_098 OR wide_mx1_098 { } TEMP=wide_098
34  BOOLEAN wide_042_098 OR skinny_mxmx1 { } TEMP=via_check_region
35  flatten via_check_region { cell_list = { Z9462G } } temp=flat_region
36  BOOLEAN wide_042_098 NOT wide_098 { } TEMP=wide_042
37  BOOLEAN via2_exd AND wide_042 { } TEMP=v042
38  BOOLEAN via2_exd AND wide_098 { } TEMP=v098
39  BOOLEAN via2_exd AND via_check_region { } TEMP=vias_under_test
40  SIZE vias_under_test INSIDE via_check_region {
41      OVERSIZE=0.145 INCREMENT=0.12
42      DELETE_NOT=TRUE } TEMP=test_029
43  SIZE test_029 INSIDE via_check_region {
44      OVERSIZE=0.14 INCREMENT=0.12
45      DELETE_NOT=TRUE } TEMP=test_057
46  SIZE test_057 { OVERSIZE=0.1 } TEMP=os_via_077
47  BOOLEAN os_via_077 AND via_check_region { } TEMP=test_077
48  SELECT test_029 INTERACT v042 { }TEMP=test_042_029
49  SELECT test_057 INTERACT v042 { }TEMP=test_042_057
50  SELECT test_029 INTERACT v098 { }TEMP=test_098_029
51  SELECT test_077 INTERACT v098 { }TEMP=test_098_077
52  SELECT test_042_029 INTERACT vias_under_test {
53      RANGE = [2,99999]}TEMP=good_042_029
54  SELECT test_042_057 INTERACT vias_under_test {
55      RANGE = [4,99999]}TEMP=good_042_057
56  SELECT test_098_029 INTERACT vias_under_test {
57      RANGE = [4,99999]}TEMP=good_098_029
58  SELECT test_098_077 INTERACT vias_under_test {
59      RANGE = [9,99999]}TEMP=good_098_077
60  BOOLEAN good_042_029 OR good_042_057 { } TEMP=good_042_region
61  SELECT wide_042 INTERACT good_042_region { }TEMP=good_wide_042
62  BOOLEAN v042 NOT good_wide_042 { } TEMP=bad_042_via
63  SELECT via2_exd INTERACT bad_042_via { }TEMP=bad_042_via
64  BOOLEAN good_098_029 OR good_098_077 { } TEMP=good_098_region
65  SELECT wide_098 INTERACT good_098_region { }TEMP=good_wide_098
66  BOOLEAN v098 NOT good_wide_098 { } TEMP=bad_098_via
67  SELECT via2_exd INTERACT bad_098_via { }TEMP=bad_098_via
68  BOOLEAN bad_042_via OR bad_098_via {
69      COMMENT = "RuleR4R5Via2"} TEMP=e202
70  cell_extent { cell_list = { * } } temp=bboxlayer
71  Partition_hierarchy bboxlayer { N_by_M = [4, 2] ambit = 0.010}
72  PARTITION_DATA {
73      partition = 1
74      input_layers = { SRM M2I M3I VIA2I FWI PMDMY EXCLI
75  SEALRING }
76      output_layers = { SRM_R1 M2I_R1 M3I_R1 VIA2I_R1 FWI_R1
77  PMDMY_R1 EXCLI_R1 SEALRING_R1 }
78  }
79  BOOLEAN SRM_R1 NOT SRM_R1 TEMP=SRM_fuzzy1
80  BOOLEAN M2I_R1 NOT M2I_R1 TEMP=M2I_fuzzy1
81  BOOLEAN M3I_R1 NOT M3I_R1 TEMP=M3I_fuzzy1
82  BOOLEAN VIA2I_R1 NOT VIA2I_R1 TEMP=VIA2I_fuzzy1
83  BOOLEAN FWI_R1 NOT FWI_R1 TEMP=FWI_fuzzy1
84  BOOLEAN PMDMY_R1 NOT PMDMY_R1 TEMP=PMDMY_fuzzy1
85  BOOLEAN EXCLI_R1 NOT EXCLI_R1 TEMP=EXCLI_fuzzy1
86  BOOLEAN SEALRING_R1 NOT SEALRING_R1 TEMP=SEALRING_fuzzy1
87  ECODE { internal_name = NOT
88      input_layers = { EXCLI_R1 SRM_R1 EXCLI_fuzzy1 SRM_fuzzy1 }
```

```
 89         output_layers = { excl_R1 excl_fuzzy1 EXCLI_cmdfuzzy1_1
 90 SRM_cmdfuzzy1_1 }
 91         vars = 1 drc_params { }
 92 }
 93 ECODE { internal_name = OR
 94         input_layers = { excl_R1 SRM_R1 excl_fuzzy1 SRM_fuzzy1 }
 95         output_layers = { excl_srm_R1 excl_srm_fuzzy1 }
 96         vars = 1 drc_params { }
 97 }
 98 ECODE { internal_name = SELECT_INSIDE
 99         input_layers = { M2I_R1 excl_R1 M2I_fuzzy1 excl_fuzzy1 }
100         output_layers = {M2I_INS_excl1_R1 M2I_INS_excl1_fuzzy1
101 M2I_cmdfuzzy3_1 excl_cmdfuzzy3_1 }
102         vars = 1 drc_params { }
103 }
104 ECODE { internal_name = SELECT_OUTSIDE
105         input_layers = { M2I_R1 M2I_INS_excl1_R1 M2I_fuzzy1
106 M2I_INS_excl1_fuzzy1 }
107         output_layers = { m2_R1 m2_fuzzy1 M2I_cmdfuzzy4_1
108 M2I_INS_excl1_cmdfuzzy4_1 }
109         vars = 1 drc_params { }
110 }
111 ECODE { internal_name = SELECT_INSIDE
112         input_layers = { VIA2I_R1 excl_R1 VIA2I_fuzzy1 excl_fuzzy1 }
113         output_layers = { VIA2I_INS_excl1_R1 VIA2I_INS_excl1_fuzzy1
114 VIA2I_cmdfuzzy5_1 excl_cmdfuzzy5_1 }
115         vars = 1 drc_params { }
116 }
117 ECODE { internal_name = SELECT_OUTSIDE
118         input_layers = { VIA2I_R1 VIA2I_INS_excl1_R1 VIA2I_fuzzy1
119 VIA2I_INS_excl1_fuzzy1 }
120         output_layers = { via2_R1 via2_fuzzy1 VIA2I_cmdfuzzy6_1
121 VIA2I_INS_excl1_cmdfuzzy6_1 }
122         vars = 1 drc_params { }
123 }
124 ECODE { internal_name = SELECT_INSIDE
125         input_layers = { M3I_R1 excl_R1 M3I_fuzzy1 excl_fuzzy1 }
126         output_layers = { M3I_INS_excl1_R1 M3I_INS_excl1_fuzzy1
127 M3I_cmdfuzzy7_1 excl_cmdfuzzy7_1 }
128         vars = 1 drc_params { }
129 }
130 ECODE { internal_name = SELECT_OUTSIDE
131         input_layers = { M3I_R1 M3I_INS_excl1_R1 M3I_fuzzy1
132 M3I_INS_excl1_fuzzy1 }
133         output_layers = { m3_R1 m3_fuzzy1 M3I_cmdfuzzy8_1
134 M3I_INS_excl1_cmdfuzzy8_1 }
135         vars = 1 drc_params { }
136 }
137 ECODE { internal_name = NOT
138         input_layers = { FWI_R1 excl_srm_R1 FWI_fuzzy1 excl_srm_fuzzy1 }
139         output_layers = { fw_R1 fw_fuzzy1 FWI_cmdfuzzy9_1
140 excl_srm_cmdfuzzy9_1 }
141         vars = 1 drc_params { }
142 }
143 ECODE { internal_name = NOT
144         input_layers = { PMDMY_R1 fw_R1 PMDMY_fuzzy1 fw_fuzzy1 }
145         output_layers = { rngx_R1 rngx_fuzzy1 PMDMY_cmdfuzzy10_1
146 fw_cmdfuzzy10_1 }
147         vars = 1 drc_params { }
148 }
149 ECODE { internal_name = OR
150         input_layers = { rngx_R1 SEALRING_R1 rngx_fuzzy1
151 SEALRING_fuzzy1 }
152         output_layers = { via_exd_R1 via_exd_fuzzy1 }
153         vars = 1 drc_params { }
154 }
155 ECODE { internal_name = NOT
156         input_layers = { via2_R1 via_exd_R1 via2_fuzzy1 via_exd_fuzzy1 }
157         output_layers = { via2_exd_R1 via2_exd_fuzzy1 via2_cmdfuzzy12_1
158 via_exd_cmdfuzzy12_1 }
159         vars = 1 drc_params { }
160 }
161 ECODE { internal_name = SIZE
162         input_layers = { m2_R1 m2_fuzzy1 }
163         output_layers = { m2wide_042_098_R1 m2wide_042_098_fuzzy1
164 m2_cmdfuzzy13_1 }
165         vars = 1 drc_params {     UNDER_OVER=0.21
166         CLIP_ACUTE=TRUE }
167 }
168 ECODE { internal_name = SIZE
```

```
                                        -continued 169         input_layers = { m2wide__042__098__R1 m2wide__042__098__fuzzy1 }
170         output_layers = { m2wide__098__R1 m2wide__098__fuzzy1
171 m2wide__042__098__cmdfuzzy14__1 }
172         vars = 1 drc__params {       UNDER__OVER=0.49
173         CLIP__ACUTE=TRUE }
174 }
175 ECODE { internal__name = SIZE
176         input_layers = { m3__R1 m3__fuzzy1 }
177         output_layers = { m3wide__042__098__R1 m3wide__042__098__fuzzy1
178 m3__cmdfuzzy15__1 }
179         vars = 1 drc__params {       UNDER__OVER=0.21
180         CLIP__ACUTE=TRUE }
181 }
182 ECODE { internal__name = SIZE
183         input_layers = { m3wide__042__098__R1 m3wide__042__098__fuzzy1 }
184         output_layers = { m3wide__098__R1 m3wide__098__fuzzy1
185 m3wide__042__098__cmdfuzzy16__1 }
186         vars = 1 drc__params {       UNDER__OVER=0.49
187         CLIP__ACUTE=TRUE }
188 }
189 ECODE { internal__name = AND
190         input_layers = { m2wide__042__098__R1 m3__R1 m2wide__042__098__fuzzy1
191 m3__fuzzy1 }
192         output_layers = { wide__mx__042__098__R1 wide__mx__042__098__fuzzy1
193 m2wide__042__098__cmdfuzzy17__1 m3__cmdfuzzy17__1 }
194         vars = 1 drc__params { }
195 }
196 ECODE { internal__name = AND
197         input_layers = { m3wide__042__098__R1 m2__R1 m3wide__042__098__fuzzy1
198 m2__fuzzy1 }
199         output_layers = { wide__mx1__042__098__R1 wide__mx1__042__098__fuzzy1
200 m3wide__042__098__cmdfuzzy18__1 m2__cmdfuzzy18__1 }
201         vars = 1 drc__params { }
202 }
203 ECODE { internal__name = OR
204         input_layers = { wide__mx__042__098__R1 wide__mx1__042__098__R1
205 wide__mx__042__098__fuzzy1 wide__mx1__042__098__fuzzy1 }
206         output_layers = { wide__042__098__R1 wide__042__098__fuzzy1 }
207         vars = 1 drc__params { }
208 }
209 ECODE { internal__name = SELECT__INTERACT
210         input_layers = { m2__R1 m2wide__042__098__R1 m2__fuzzy1
211 m2wide__042__098__fuzzy1 }
212         output_layers = { mx__with__skinny__R1 mx__with__skinny__fuzzy1
213 m2__cmdfuzzy20__1 m2wide__042__098__cmdfuzzy20__1 }
214         vars = 1 drc__params { }
215 }
216 ECODE { internal__name = NOT
217         input_layers = { mx__with__skinny__R1 m2wide__042__098__R1
218 mx__with__skinny__fuzzy1 m2wide__042__098__fuzzy1 }
219         output_layers = { skinny__mx__R1 skinny__mx__fuzzy1
220 mx__with__skinny__cmdfuzzy21__1 m2wide__042__098__cmdfuzzy21__1 }
221         vars = 1 drc__params { }
222 }
223 ECODE { internal__name = SELECT__INTERACT
224         input_layers = { m3__R1 m3wide__042__098__R1 m3__fuzzy1
225 m3wide__042__098__fuzzy1 }
226         output_layers = { mx1__with__skinny__R1 mx1__with__skinny__fuzzy1
227 m3__cmdfuzzy22__1 m3wide__042__098__cmdfuzzy22__1 }
228         vars = 1 drc__params { }
229 }
230 ECODE { internal__name = NOT
231         input_layers = { mx1__with__skinny__R1 m3wide__042__098__R1
232 mx1__with__skinny__fuzzy1 m3wide__042__098__fuzzy1 }
233         output_layers = { skinny__mx1__R1 skinny__mx1__fuzzy1
234 mx1__with__skinny__cmdfuzzy23__1 m3wide__042__098__cmdfuzzy23__1 }
235         vars = 1 drc__params { }
236 }
237 ECODE { internal__name = OR
238         input_layers = { skinny__mx__R1 skinny__mx1__R1 skinny__mx__fuzzy1
239 skinny__mx1__fuzzy1 }
240         output_layers = { skinny__mxmx1__R1 skinny__mxmx1__fuzzy1 }
241         vars = 1 drc__params { }
242 }
243 ECODE { internal__name = AND
244         input_layers = { m2wide__098__R1 m3__R1 m2wide__098__fuzzy1
245 m3__fuzzy1 }
246         output_layers = { wide__mx__098__R1 wide__mx__098__fuzzy1
247 m2wide__098__cmdfuzzy25__1 m3__cmdfuzzy25__1 }
248         vars = 1 drc__params { }
```

-continued

```
249  }
250  ECODE { internal_name = AND
251      input_layers = { m3wide_098_R1 m2_R1 m3wide_098_fuzzy1
252  m2_fuzzy1 }
253      output_layers = { wide_mx1_098_R1 wide_mx1_098_fuzzy1
254  m3wide_098_cmdfuzzy26_1 m2_cmdfuzzy26_1 }
255      vars = 1 drc_params { }
256  }
257  ECODE { internal_name = OR
258      input_layers = { wide_mx_098_R1 wide_mx1_098_R1
259  wide_mx_098_fuzzy1 wide_mx1_098_fuzzy1 }
260      output_layers = { wide_098_R1 wide_098_fuzzy1 }
261      vars = 1 drc_params { }
262  }
263  PARTITION_DATA {
264      partition = 0
265      input_layers = { SRM M2I M3I M4I VIA2I FWI PMDMY EXCLI
266  SEALRING }
267      output_layers = { SRM_R0 M2I_R0 M3I_R0 VIA2I_R0 FWI_R0
268  PMDMY_R0 EXCLI_R0 SEALRING_R0 }
269  }
270  BOOLEAN EXCLI_cmdfuzzy1_1 OR EXCLI_cmdfuzzy1_2 OR
271  EXCLI_cmdfuzzy1_3 OR EXCLI_cmdfuzzy1_4 OR EXCLI_cmdfuzzy1_5 OR
272  EXCLI_cmdfuzzy1_6 OR EXCLI_cmdfuzzy1_7 OR EXCLI_cmdfuzzy1_8 { }
273  TEMP=EXCLI_cmdfuzzy1
274  BOOLEAN SRM_cmdfuzzy1_1 OR SRM_cmdfuzzy1_2 OR SRM_cmdfuzzy1_3
275  OR SRM_cmdfuzzy1_4 OR SRM_cmdfuzzy1_5 OR SRM_cmdfuzzy1_6 OR
276  SRM_cmdfuzzy1_7 OR SRM_cmdfuzzy1_8 { } TEMP=SRM_cmdfuzzy1
277  ECODE { internal_name = NOT
278      input_layers = { EXCLI_R0 SRM_R0 EXCLI_cmdfuzzy1
279  SRM_cmdfuzzy1 }
280      output_layers = { excl_R0 }
281      vars = 0 drc_params { }
282  }
283  Merge_partitions e202_R0 e202_R1 e202_R2 e202_R3 e202_R4 e202_R5
284  e202_R6 e202_R7 e202_R8 { } temp=all_e202
285  boolean e202 XOR all_e202 { } temp=diff
286
```

```
287                      APPENDIX B
288  BOOLEAN bad_042_via OR bad_098_via {
289      COMMENT = "RuleR4R5Via2"} TEMP=e202
290  Input layer "bad_042_via" is empty.
291  6 unique polygons written.
292    Check time = 0:00:00 User=0.00 Sys=0.00 Mem=111.641
293  MERGE_PARTITIONS e202_R0 e202_R1 e202_R2 e202_R3
     e202_R4 e202_R5
294  e202_R6 e202_R7 e202_R8 { } TEMP=all_e202
295  WARNING - 6 unique polygons written.
296    Check time = 0:00:00 User=0.05 Sys=0.03 Mem=138.496
297  BOOLEAN e202 XOR all_e202 { } TEMP=diff
298  No output written.
299  Layer "diff" is empty.
300    Check time = 0:00:00 User=0.09 Sys=0.02 Mem=140.683
```

What is claimed is:

1. A computer-implemented method of analyzing a plurality of regions in a layout of an integrated circuit device for violation of a plurality of predetermined rules, the method comprising:

subdividing the layout into a plurality of regions;

performing rule checking locally, on each of multiple sets of polygons located within multiple corresponding regions of the layout, as to whether or not a rule in the plurality of predetermined rules is satisfied;

generating data comprising a first subset of polygons selected within each set from each corresponding region, to be checked regardless of boundaries between regions;

for each region of the layout, propagating a second subset of polygons from checking of said rule to checking of a next rule that follows said rule in a runset;

at least one processor merging data generated from multiple regions, to yield merged data, at least by reconstituting a polygon in said layout from a plurality of portions of said polygon formed by said subdividing and located in a plurality of first subsets generated from corresponding regions; and performing rule checking globally on at least the merged data, including said polygon obtained by reconstituting and spanning across multiple regions, regardless of boundaries between the multiple regions, as to whether or not said rule is satisfied, thereby to identify, from within the merged data, a feature not previously identified by said performing rule checking locally.

2. The method of claim 1 further comprising:

repeating said performing rule checking locally, with each rule in the plurality of predetermined rules other than said rule;

repeating said generating data, said merging data and said performing rule checking globally, with each rule in the plurality of predetermined rules other than said rule; and combining results of each performing rule checking to yield a final result.

3. The method of claim 1 wherein:

additional data comprises said second subset of polygons;

said additional data is generated as a result of performing rule checking locally; and the method comprises further checking said additional data locally within each region.

4. The method of claim 1 wherein:

said subdividing consists essentially of inserting a boundary line between two regions without regard to locations of features in the layout.

5. The method of claim 1 wherein:
said subdividing comprises inserting a boundary line between two regions to minimize a number of features being cut up.

6. The method of claim 1 wherein:
said subdividing comprises inserting a boundary line between two regions to minimize violation of minimum spacing requirements.

7. A non-transitory computer-readable storage medium encoded with a plurality of instructions which when executed by at least one processor, perform a method of analyzing a plurality of regions of a layout of an integrated circuit device for violation of a plurality of predetermined rules, the plurality of instructions comprising:
instructions to subdivide the layout into a plurality of regions;
instructions to perform rule checking locally, on each of multiple sets of polygons located within multiple corresponding regions of the layout, as to whether or not a rule in the plurality of predetermined rules is satisfied;
instructions to generate data comprising a first subset of polygons selected within each set from each corresponding region, to be checked regardless of boundaries between regions;
instructions to propagate a second subset of polygons from execution of instructions to check said rule to instructions to check another rule in the plurality of predetermined rules;
instructions to merge data generated from multiple regions, to yield merged data, at least by reconstituting a polygon in said layout from a plurality of portions of said polygon formed by said subdividing and located in a plurality of first subsets generated from corresponding regions; and
instructions to perform rule checking globally on at least the merged data, including said polygon obtained by reconstituting and spanning across multiple regions, regardless of boundaries between the multiple regions, as to whether or not said rule is satisfied, thereby to identify, from within the merged data, a feature not previously identified by execution of said instructions to perform rule checking locally.

8. A computer-implemented method of analyzing a plurality of regions in a layout of an integrated circuit device for violation of a plurality of predetermined rules, the method comprising:
subdividing the layout into a plurality of first regions;
performing rule checking, on each of multiple sets of polygons located within multiple corresponding first regions of the layout, as to whether or not a rule in the plurality of predetermined rules is satisfied;
generating first data comprising a first subset of polygons selected within each set from each corresponding first region, to be checked regardless of boundaries between first regions;
at least one processor merging first data generated from multiple first regions, to yield first merged data, at least by reconstituting a first polygon in said layout from a plurality of portions of said first polygon formed by said subdividing and located in a plurality of first subsets generated from corresponding first regions;
subdividing said first merged data into a plurality of second regions to yield a corresponding plurality of individual merged data portions;
performing rule checking on each individual merged data portion, as to whether or not said rule in the plurality of predetermined rules is satisfied;
generating second data comprising a second subset of polygons selected within each set from each corresponding second region, to be checked regardless of boundaries between second regions;
merging second data generated from multiple second regions, to yield second merged data, at least by reconstituting a second polygon in said layout from a plurality of portions of said second polygon located in a plurality of second subsets generated from corresponding second regions; and
performing rule checking on at least the second merged data, including said second polygon, as to whether or not said rule is satisfied, thereby to identify, from within the second merged data, a feature not previously identified by said performing rule checking on each of multiple sets of polygons and by said performing rule checking on each individual merged data portion.

9. The method of claim 8 wherein:
said second regions are identical in size to said first regions.

10. The method of claim 8 wherein:
said second regions are larger than said first regions.

11. A non-transitory computer-readable storage medium encoded with a plurality of instructions which when executed by at least one processor, perform a method of analyzing a plurality of regions in a layout of an integrated circuit device for violation of a plurality of predetermined rules, the plurality of instructions comprising:
instructions to subdivide the layout into a plurality of first regions;
instructions to perform rule checking on each of multiple sets of polygons located within multiple corresponding first regions of the layout, as to whether or not a rule in the plurality of predetermined rules is satisfied;
instructions to generate first data comprising a first subset of polygons selected within each set from each corresponding first region, to be checked regardless of boundaries between first regions;
instructions to merge first data generated from multiple first regions, to yield first merged data, at least by reconstituting a first polygon in said layout from a plurality of portions of said first polygon formed by said subdividing and located in a plurality of first subsets generated from corresponding first regions;
instructions to subdivide said first merged data into a plurality of second regions to yield a corresponding plurality of individual merged data portions;
instructions to perform rule checking on each individual merged data portion, as to whether or not said rule in the plurality of predetermined rules is satisfied;
instructions to generate second data comprising a second subset of polygons selected within each set from each corresponding second region, to be checked regardless of boundaries between second regions;
instructions to merge second data generated from multiple second regions, to yield second merged data, at least by reconstituting a second polygon in said layout from a plurality of portions of said second polygon located in a plurality of second subsets generated from corresponding second regions; and
instructions to perform rule checking on at least the second merged data, including said second polygon, as to whether or not said rule is satisfied, thereby to identify, from within the second merged data, a feature not previously identified by execution of said instructions to performing rule checking on each of multiple sets and by execution of said instructions to perform rule checking on each individual merged data portion.

12. The method of claim 8 further comprising:
propagating additional data locally within each region of the layout, from checking of said rule to checking of another rule in the plurality of predetermined rules.

13. A system comprising a plurality of processors and a corresponding plurality of memories, each memory being coupled to a processor, each memory being encoded with plurality of predetermined rules to be used in analyzing a layout of an integrated circuit device, wherein:
- in said plurality of processors, a group of processors check shapes in an individual regions of the layout, as to whether or not a selected rule, in the plurality of predetermined rules, is satisfied; and
- the group of processors generate data indicative of any shapes on which the selected rule could not be checked in each region;
- the group of processors propagate additional data locally within each region of the layout, from checking of the selected rule to checking of another rule in the plurality of predetermined rules;
- a master processor among said plurality of processors merges shapes identified in the generated data regardless of region, to yield merged data; and
- wherein data input to the master processor, generated from a processor in the group of processors for a given region, identifies multiple shapes in the given region spanning across a boundary of the given region; and
- the master processor applies said selected rule globally across the plurality of regions, on the merged data to identify a shape not previously identified by said group of processors, for not satisfying said selected rule.

14. The system of claim 13 wherein:
the master processor combines results of the group of processors.

15. An apparatus for analyzing a layout of an integrated circuit device, the apparatus comprising:
- a plurality of first means for checking shapes in a corresponding plurality of regions of the layout as to whether or not a selected rule, in a plurality of predetermined rules, is satisfied;
- a plurality of second means, equal in number to the first means, for generating data indicative of any shapes on which the selected rule could not be checked in each region;
- the plurality of second means propagating additional data locally within each region of the layout, from checking of the selected rule to checking of another rule in the plurality of predetermined rules;
- means for merging shapes identified in the generated data regardless of region, to yield merged data; and
- wherein data input to the means for merging, generated from a given region, identifies shapes in the given region spanning across a boundary of the given region; and
- means for applying the selected rule globally across the plurality of regions, on the merged data to identify shape not previously identified by said first means, for not satisfying said selected rule.

16. The apparatus of claim 15 further comprising:
means for combining results of the plurality of first means and said means for applying the selected rule globally.

17. The apparatus of claim 15 wherein:
- said additional data is generated as a result of performing rule checking locally; and
- the apparatus comprises means for checking said additional data locally within each region.

18. The apparatus of claim 15 further comprising:
- means for subdividing merged data into a plurality of second regions to yield a corresponding plurality of individual merged data portions; and
- means for performing rule checking locally on each individual merged data portion, as to whether or not said selected rule is satisfied.

* * * * *

UNITED STATES PATENT AND TRADEMARK OFFICE
CERTIFICATE OF CORRECTION

PATENT NO. : 7,945,872 B2
APPLICATION NO. : 12/559478
DATED : May 17, 2011
INVENTOR(S) : Yulan Wang It is certified that error appears in the above-identified patent and that said Letters Patent is hereby corrected as shown below:

Column 27
Line 11, delete "an".

Signed and Sealed this
Fifth Day of July, 2011

David J. Kappos
*Director of the United States Patent and Trademark Office*